US009379162B2

(12) United States Patent
Bandyopadhyay et al.

(10) Patent No.: US 9,379,162 B2
(45) Date of Patent: Jun. 28, 2016

(54) MAGNETO-ELASTIC NON-VOLATILE MULTIFERROIC LOGIC AND MEMORY WITH ULTRALOW ENERGY DISSIPATION

(71) Applicant: Virginia Commonwealth University, Richmond, VA (US)

(72) Inventors: Supriyo Bandyopadhyay, Glen Allen, VA (US); Jayasimha Atulasimha, Glen Allen, VA (US); Ayan Kumar Biswas, Richmond, VA (US)

(73) Assignee: Virginia Commonwealth University, Richmond, VA (US)

( * ) Notice: Subject to any disclaimer, the term of this patent is extended or adjusted under 35 U.S.C. 154(b) by 11 days.

(21) Appl. No.: 14/546,393

(22) Filed: Nov. 18, 2014

(65) Prior Publication Data
US 2016/0141333 A1    May 19, 2016

(51) Int. Cl.
| | |
|---|---|
| G11C 11/00 | (2006.01) |
| H01L 27/22 | (2006.01) |
| H01L 43/02 | (2006.01) |
| H01L 43/08 | (2006.01) |
| H01L 41/047 | (2006.01) |
| H01L 41/08 | (2006.01) |
| G11C 11/16 | (2006.01) |

(52) U.S. Cl.
CPC .............. *H01L 27/222* (2013.01); *G11C 11/16* (2013.01); *G11C 11/1675* (2013.01); *H01L 41/047* (2013.01); *H01L 41/0805* (2013.01); *H01L 43/02* (2013.01); *H01L 43/08* (2013.01)

(58) Field of Classification Search
CPC ....... H01L 27/222; H01L 43/02; H01L 43/08; H01L 41/047; H01L 41/0805; G11C 11/16; G11C 11/1675

USPC .......................... 365/158, 161, 163, 171, 173
See application file for complete search history.

(56) References Cited

U.S. PATENT DOCUMENTS

| | | | | |
|---|---|---|---|---|
| 2011/0170339 A1* | 7/2011 | Wunderlich | ....... | G11C 11/1675 365/158 |
| 2012/0267735 A1* | 10/2012 | Atulasimha | ............ | G11C 11/16 257/421 |

OTHER PUBLICATIONS

Ney, A. et al. "Programmable computing with a single magnetoresistive element". Nature 425: 485-7(2003). Print.
Liang, Cheng-Yen, et al. "Electrical control of a single magnetoelastic domain structure on a clamped piezoelectric thin film—analysis". Journal of Applied Physics 116, 123909 (2014); doi: 10.1063/1.4896549.

* cited by examiner

*Primary Examiner* — Toan Le
(74) *Attorney, Agent, or Firm* — Whitham, Curtis & Cook, P.C.

(57) ABSTRACT

Memory cells, non-volatile logic gates, and combinations thereof have magneto-tunneling junctions (MTJs) which are switched using potential differences across a piezoelectric layer in elastic contact with a magnetostrictive nanomagnet of an MTJ. One or more pairs of electrodes are arranged about the MTJ for supplying voltage across the piezoelectric layer for switching. A permanent magnetic field may be employed to change the positions of the stable magnetic orientations of the magnetostrictive nanomagnet. Exemplary memory cells and universal non-volatile logic gates show dramatically improved performance characteristics, particularly with respect to energy dissipation and error-resilience, over existing methods and architectures for switching MTJs such as spin transfer torque (STT) techniques.

20 Claims, 10 Drawing Sheets

MAGNETO-ELASTIC NON-VOLATILE MULTIFERROIC LOGIC AND MEMORY WITH ULTRALOW ENERGY DISSIPATION

STATEMENT OF GOVERNMENT INTEREST

This invention was made with government support under contract numbers ECCS-1124714 awarded by the National Science Foundation. The government has certain rights in the invention.

FIELD OF THE INVENTION

This invention pertains to non-volatile memory and Boolean logic and, more particularly, memory cells and Boolean logic gates implemented with magneto-tunneling junctions (MTJs) where the soft layer of the MTJ is switched with strain generated by a voltage, resulting in ultralow energy dissipation during logic operation or writing of data into memory.

BACKGROUND

Magnetic random access memory (MRAM) for non-volatile storage of data is typically implemented with a magneto-tunneling junction (MTJ) whose two resistance states ("high" and "low") encode the binary bits "1" and "0". The MTJ has a hard and a soft magnetic layer separated by a spacer. Each of the two layers is usually elliptical and has two stable magnetization states along the major axis of the ellipse. When the magnetizations of the two layers are parallel, the MTJ resistance is low, and when they are anti-parallel, the resistance is high. Writing a bit into an MRAM cell therefore merely involves changing the resistance of the MTJ by orienting the magnetization of the soft layer either parallel or anti-parallel to that of the hard layer.

The oldest bit writing scheme used a current-induced magnetic field to orient the soft layer's magnetization. More recent schemes use spin transfer torque (STT) generated by passing a current through the MTJ, or domain wall motion, or manipulation of Rashba spin-orbit interaction at interfaces, or modulation of interface exchange coupling at a ferroelectric/ferromagnetic interface with an electric field, to orient the soft layer's magnetization. Most of these schemes are extremely dissipative and result in dissipating $\sim 10^7$ kT of energy per bit at room temperature (1 kT=$4 \times 10^{-21}$ Joules at room temperature), making them extremely energy-inefficient and power hungry. Recently, more energy-efficient schemes have been demonstrated and involve rotating the soft layer's magnetization either with a spin-polarized current generated via spin-Hall effect, or with voltage-controlled magnetic anisotropy in oxides, or with voltage controlled spin-orbit torque in ferromagnets and magnetically doped topological insulators, or with voltage-generated uniaxial strain/stress in a shape anisotropic magnetostrictive-piezoelectric (multiferroic) nanomagnet. The strain/stress is generated by applying an electrical voltage across the piezoelectric layer of the multiferroic nanomagnet.

Unfortunately, strain/stress as used in methods in the preceding paragraph can only rotate the magnetization of an elliptical multiferroic nanomagnet by up to $\sim 90°$, which means that it is not able to "flip" the magnetization from one stable state to the other since that requires a $\sim 180°$ rotation. When the magnetization is rotated to $\sim 90°$, there is an approximately equal probability of the magnetization going to either of the two stable orientations once strain is removed. This gives a $\sim 50\%$ probability of successfully writing a bit into an MRAM cell. The only way to reliably achieve a full 180° rotation with each application of stress is to withdraw the stress as soon as the magnetization vector has rotated exactly 90° from the original orientation. If this withdrawal is timed with very high precision, a residual torque due to the magnetization vector's out of plane component may continue to rotate it beyond 90° and achieve a "flip" with very high probability (>99.99% at room temperature), resulting in very high likelihood of writing a bit successfully into an MRAM cell. The problem with this methodology, however, is that such precisely timed withdrawal of stress requires a feedback mechanism that determines when the magnetization has completed the 90° rotation and feeds that information back to the voltage generator to withdraw the stress at exactly the right juncture. Such feedback circuitry introduces extremely high dissipative energy loss and defeats the benefits of using straintronic memory. This makes this strategy unappealing.

With respect to Boolean logic, there is significant interest in 'non-volatile logic' because the ability to store and process information with the same device affords immense flexibility in designing computing architectures. Non-volatile logic based architectures can reduce overall energy dissipation by eliminating refresh clock cycles, improve system reliability, improve reliability by eliminating processor-memory communication, and produce 'instant-on' computers with virtually no boot delay. A number of non-volatile universal logic gates have been proposed to date, but they do not necessarily satisfy all the requirements for a logic gate and therefore may not be usable in all circumstances. Cowburn et al. (Cowburn, R. P. & Welland, M. E. Room temperature magnetic quantum cellular automata. *Science* 287, 1466-1468 (2000)) proposed an idea where digital bits are stored in the magnetization orientations of an array of dipole-coupled nanomagnets, and dipole coupling between neighbors elicits logic operation on the bits. This gate is not concatenable since the input and output bits are encoded in dissimilar physical quantities: the inputs are encoded in directions of magnetic fields and the output is encoded in the magnetization orientation of a magnet. Thus, the output of a preceding gate cannot act as the input to the succeeding gate without additional transducer hardware to convert the magnetization orientation of a nanomagnet into the direction of a magnetic field. Such transducer hardware drastically reduces the energy efficiency of the logic gates and makes them more error-prone. The gate also lacks true power gain since the energy needed to switch the output comes from the inputs and not an independent source such as a power supply. This makes its operation unreliable. More importantly, logic information cannot unidirectionally stream from the input gates to the output gates without multiphase clocking of the gates [a scheme known as "Bennett clocking"; C. H. Bennett, The thermodynamics of computation—A review. *International Journal of Theoretical Physics*, 21, 905-940 (1982)] which dissipates exorbitant amount of energy. Bennett clocking cannot be dispensed with since the unidirectional streaming is required for every logic operation. Additionally, the strength of dipole coupling between magnets, which is critical for logic operation, decreases as the square of the magnet's volume. This limits scalability because the magnets' sizes cannot be scaled down arbitrarily without endangering safe operation of the gates. Finally, dipole coupling between the magnets is never sufficiently resilient against thermal noise, resulting in unacceptably large dynamic bit error probability in dipole-coupled logic gates.

Ney et al. (Ney, A., Pampuch, C., Koch, R. & Ploog, K. H. Programmable computing with a single magnetoresistive element. *Nature* 425, 485-487 (2003)) proposed a different construct where a NAND gate was implemented with a single magneto-tunneling junction (MTJ) placed close to four current lines, two of which ferry the two input bits to the gate, the third is required for an initialization operation, and the fourth carries the output. The magnetic fields generated by the input currents flip the magnetization of the MTJ's soft layer and switch its resistance, thereby switching the magnitude of the output current and performing NAND logic operation. This gate has the advantage of not requiring Bennett clocking and has also been experimentally demonstrated (Wang, J., Meng, H & Wang, J-P, Programmable spintronics logic device based on magnetic tunneling junction element. J. *Appl. Phys.*, 97, 10D509 (2005)). Unfortunately, this gate too is not directly concatenable since the input bits are encoded in the directions of the input currents while the output bit is encoded in the magnitude of the output current. Moreover, since it is difficult to confine magnetic fields to small regions, the separation between neighboring devices must be large. Individual devices can be small in size, but because the inter-device pitch is large, the device density will be small. Finally, there is some chance that the output current can also, by itself, switch the magnetization of the magnetic layers and therefore affect its own state. This is equivalent to lack of isolation between the input and the output. Thus, while these devices are interesting in their own right, they may not be universally usable.

A more recent scheme that overcomes some of the above shortcomings was proposed by Behin-Aein et al. (Behin-Aein, B., Datta, D., Salahuddin, S. & Datta S., Proposal for an all-spin logic device with built-in memory. *Nature Nanotech.* 5, 266-269 (2010)) and Srinivasan et al. (Srinivasan, S., Sarkar, A., Behin-Aein, B. & Datta, S. All-spin logic device with in-built non-reciprocity. *IEEE Trans. Magn.* 47 4026-4032 (2011)). It implements a non-volatile universal logic gate with magnets switched by spin currents as opposed to charge currents (hence the name "all-spin-logic", abbreviated as ASL). Unlike charge currents, spin currents ideally dissipate no energy and therefore it was thought that this paradigm will be extremely energy-efficient. However, spin currents ultimately do require flow of charge currents (whether the spin current is generated by a spin polarizer or the "spin-Hall effect") and hence some dissipation is unavoidable. More importantly, providing isolation between input and output requires introducing an asymmetry in the gate. The original ASL idea (Behin-Aein, B., Datta, D., Salahuddin, S. & Datta S., Proposal for an all-spin logic device with built-in memory. *Nature Nanotech.* 5, 266-269 (2010)) proposed introducing this 'asymmetry' via different spin-injection efficiencies (engineered with tunnel barriers) at the input and output ends, while a later idea suggested introducing a ground terminal asymmetrically disposed between the input and output magnets (Srinivasan, S., Sarkar, A., Behin-Aein, B. & Datta, S. All-spin logic device with in-built non-reciprocity. *IEEE Trans. Magn.* 47 4026-4032 (2011)). The latter idea (simpler of the two) invariably necessitates charge current flow with accompanying dissipation. Recent calculations (Nikonov D. E. & Young, I. A., Overview of beyond-CMOS devices and a uniform methodology for their benchmarking. Proc. IEEE, 101, 2498 (2013) and Sharad, M., Yogendra, K., Gaud, A., Kwon, K-W & Roy, K. Ultrahigh density, high performance and energy-efficient all-spin logic. arXiv:1308.2280) have predicted that ASL is not particularly energy-efficient; the energy-delay product exceeds $10^{-25}$ Joules-sec which makes it two orders of magnitude worse than traditional CMOS gates. That is a high price to pay for non-volatility.

Moreover, both computation and communication between gates are carried out with a sequence of clock pulses. Unfortunately, its error-resilience has not been examined. Normally, magnetic devices are much more error-prone than transistors since magnetization dynamics is easily disrupted by thermal noise. Logic has stringent requirements on error rates, and it is important to evaluate the dynamic bit error probability of any gate to assess its viability.

Finally, the most important metric for a logic gate is the energy-delay cost. All existing non-volatile magnetic logic schemes fail in this area. The scheme in Ney et al. uses current generated magnetic fields to switch magnets and hence would dissipate at least $10^9$ kT of energy per gate operation at room temperature to switch in ~1 ns (energy-delay product=$4\times10^{-2}$ J-s). A different experiment conducted to demonstrate this scheme used on-chip current-generated magnetic fields to switch magnets and ended up dissipating approximately $10^{12}$ kT of energy per switching event, despite switching in ~1 µs (energy-delay product=$4\times10^{-15}$ J-s). The scheme in Behin-Aein et al. is expected to dissipate between $10^5$ and $10^6$ kT of energy when it switches in 1 ns (energy-delay product=$4\times10^{25}$–$4\times10^{24}$ J-s). In contrast, a low-power transistor may dissipate only $10^3$ kT of energy when it switches in 0.1 ns (energy-delay product=$3\times10^{28}$ J-s). In short, all the above non-volatile schemes appear to be far inferior to transistors in energy-delay product, which may preclude their widespread application, despite the non-volatility.

SUMMARY

Exemplary embodiments of non-volatile magnetic memory and logic gates are disclosed which flip (e.g., complete 180° rotation) the magnetization of the soft layer of an MTJ with stress alone and without the need for any feedback circuitry to precisely time the stress/strain cycle which undermines the energy-efficiency and reliability of the bit writing scheme. Stress is applied to the soft layer sequentially in two steps, instead of a single step, to rotate the magnetization by 180° with >99.9999% probability at room temperature, without requiring precisely timed stress application/withdrawal and therefore dispensing of the feedback circuit. This results in an MRAM cell where writing a bit dissipates extremely small amount of energy. The elimination of feedback circuitry for timing makes the scheme fault-tolerant and also greatly enhances the energy efficiency since the feedback circuitry would have been both unreliable and energy-inefficient. This scheme for a memory element results in extremely low energy dissipation, low write and read error rate, and reasonably fast writing speed. It may be used as a foundation for a new generation of super energy-efficient and reliable non-volatile memory.

In another aspect of the invention, there is provided a non-volatile nanomagnetic reconfigurable NAND/NOR logic gate. The inputs to the gate are provided in the form of voltages that result in a net strain in the soft magnetostrictive layer of an MTJ. If the strain due to any one input voltage being high (e.g., encoding logic bit "1") is sufficient to rotate the soft layer's magnetization, then the gate acts as a NOR gate. However, if the strain due to just one input voltage being high is not sufficient to rotate the magnetization, but the strain due to both input voltages being high is sufficient, then the gate acts as a NAND gate. This reconfigurable NAND/NOR Boolean logic gate t has a superior energy-delay product of $1.6\times10^{-26}$ J-s and superior error probability of $10^{-8}$, which makes it ideal for current device trends dictated by Moore's law. Furthermore, it satisfies all the requirements of logic. The gate error probability has been evaluated rigorously (with stochastic simulation) to establish its reliability. With careful choice of parameters, it is possible to reduce the gate error probability to below $10^{-8}$ at room temperature, which is remarkable for magnetic logic. Therefore, it is the first nanomagnetic logic gate that has the advantages of magnetic logic gates (e.g., non-volatility) without the traditional disadvantages.

DETAILED DESCRIPTION

Figure 1A:
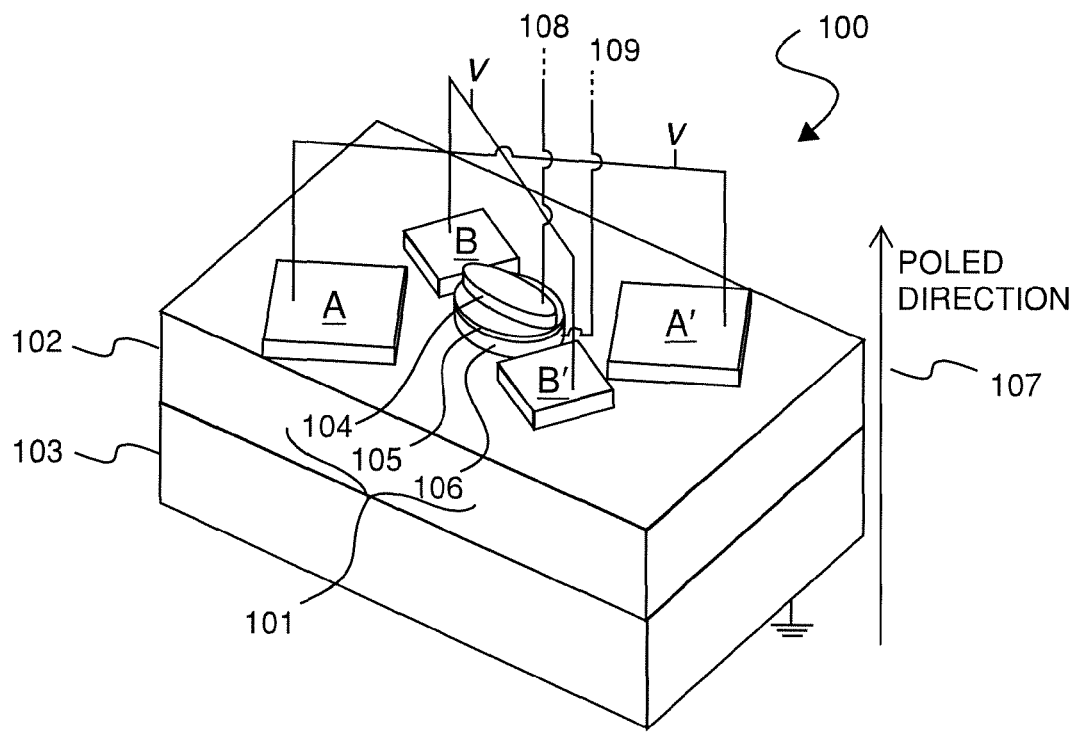
FIG. 1(a) is a schematic of an exemplary memory device according to an isometric view.
Figure 1B:
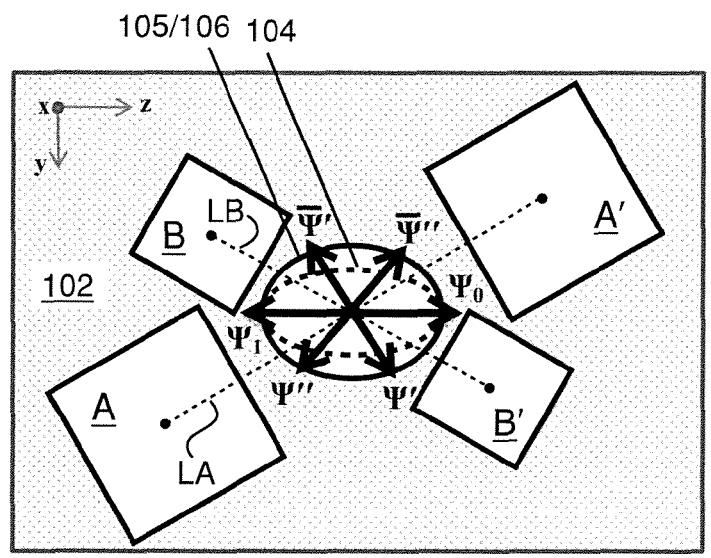
FIG. 1(b) is the schematic of FIG. 1(a) according to a top view of the memory device.

Referring now to the drawings, and more particularly to FIGS. 1(a) and 1(b), there is shown a schematic of an exemplary memory element 100 where the bit storing magneto-tunneling junction (MTJ) 101 is placed on top of a piezoelectric film 102 deposited on an $n^+$-silicon substrate 103. Note the use of $n^+$-silicon is exemplary. The substrate 103 may be any conducting substrate on which a piezoelectric material (such as but not limited to PZT, PMN-PT, Lead Niobate, etc.) can be deposited. Alternatively, the substrate 103 may be a nonconducting material, in which case an additional conducting layer (not shown in FIG. 1(a)) is interposed between the substrate 103 and the piezoelectric film 102. Generally, substrate 103 will have greater thickness than what is shown in FIG. 1(a), the drawing having a reduced thickness for simplicity of illustration. The piezoelectric film 102 may be, for example, a Lead Zirconate Titanate (PZT) thin film and is poled in the direction indicated by arrow 107 using an electric field. The hard layer 104 of the MTJ 101 has a fixed magnetic orientation (e.g., $\Psi_0$). The soft layer 106 has a magnetization with two stable orientations (e.g., $\Psi_0$ and $\Psi_1$) and is separated from the hard layer 104 by a thin insulating spacer layer 105. The geometry of the soft layer 106 or, more specifically, the magnetostrictive nanomagnet, may be in the shape of an ellipse, rectangle, parallelogram, or any other shape having two stable magnetic orientations. The illustrative exemplary embodiment shown in FIGS. 1(a) and 1(b) has a magnetostrictive nanomagnet 106 that is elliptical in shape.

In some exemplary embodiments, the soft layer 106 consists entirely of the magnetostrictive nanomagnet. As a result, descriptions herein such as "magnetization orientation", magnetization "state", or other qualities or characteristics may be made with respect to the soft layer 106 or the magnetostrictive nanomagnet, the two nouns generally referring to the same structural element. As such, for exemplary embodiments discussed herein, the numeric identifier "106" may be used with a few interchangeable names for the same structural element of the MTJ 401, including but not limited to "soft layer", "soft magnetic layer", "magnetostrictive nanomagnet", "magnetostrictive magnet", "nanomagnet", "soft magnet", or simply "magnet" (but not "hard magnet"). On a similar note, in some exemplary embodiments, hard layer 104 consists entirely of the hard magnet of the MTJ 101. Context will also make apparent to one of ordinary skill in the art whether a given description refers to the magnetostrictive nanomagnet/soft layer 106, or the hard magnet/hard layer 104.

The easy axes (e.g., the major axis of an elliptical magnetostrictive nanomagnet 106) of the hard and soft layers 104 and 106 are collinear, and the hard layer 106 is permanently magnetized in one direction (e.g., $\Psi_0$) along its easy axis. Two pairs of electrodes (e.g., electrode pads) AA' and BB' are arranged on the piezoelectric film 102, where the arrangement is preferably such that a line LA joining members of a first pair of electrodes AA' and a line LB joining members of a second pair of electrodes BB' cross and/or pass through the magnetostrictive nanomagnet 106. A line joining the members A and A' of the first pair of electrodes and a line joining the members B and B' of the second pair of electrodes are non-parallel to one another and to both stable orientations ($\Psi_0$ and $\Psi_1$) of the magnetostrictive nanomagnet 106. As used herein, "non-parallel" means neither parallel nor anti-parallel. According to the illustrative embodiment shown in FIGS. 1(a) and 1(b), the line joining the pair of electrodes AA' subtends an angle of 30° with the common major axis of the two layers 104 and 106 and the other pair of electrodes BB' subtends an angle of 150°. This is just one example, and other angles greater or less than 30° and other angles greater or less than 150° may also be used.

The magnetostrictive nanomagnet 106 is in elastic contact with the piezoelectric film 102. According to the elliptical configuration shown in FIGS. 1(*a*) and 1(*b*), the magnetostrictive nanomagnet 106 has a major axis a=110 nm, minor axis b=90 nm, and thickness d=6 nm. These are exemplary and non-limiting dimensions. The dimensions of the magnet 106 must be such that they ensure that the magnetostrictive nanomagnet 106 has a single domain and the in-plane potential energy barrier separating the stable magnetization orientations ($\Psi_0$ and $\Psi_1$) along its easy axis is sufficiently large so as to substantially prevent spontaneous magnetization flipping. For example, the in-plane potential energy barrier may be ~62.5 kT at room temperature. The probability of spontaneous magnetization flipping between the two stable states ($\Psi_0$ and $\Psi_r$) due to thermal noise (static error probability) is therefore ~$e^{-62.5}$ per attempt, leading to memory retention time $(1/f_0)e^{62.5}=4.4\times10^7$ yr, assuming the attempt frequency $f_0$ is 1 THz. These dimensions are illustrative only and are not intended to be limiting. Other embodiments may have different dimensions which also meet the criteria of the magnetostrictive nanomagnet having a single domain and having a sufficiently high in-plane potential energy barrier separating the stable magnetization orientations along the easy axis. In general, the two stable magnetization orientations ($\Psi_0$ and $\Psi_1$) will be in mutually opposite directions.

As further aspects pertaining to the illustrative embodiment shown in FIGS. 1(*a*) and 1(*b*), all four electrodes A, A', B, and B' have square cross-sections, although alternative embodiments may have electrodes with different cross sections such as rectangles, parallelograms, or some other shape. Each of the electrodes A and A' of the first pair of electrodes has an edge dimension of 120 nm, but this dimension is exemplary and not limiting. Each of the electrodes B and B' of the second pair of electrodes has an edge dimension of 80 nm, again being exemplary and not limiting. The electrode thickness is not critical and may be between 1 nm and 1000 nm, for example. The thickness of the piezoelectric film 102 is 100 nm, this size being exemplary and not limiting. The dimensions of the electrodes and piezoelectric film contribute to the following features, one or more of which are generally desired for generating proper stresses in the soft magnet 106: (1) the line joining the centers of each pair of electrodes subtends a unique angle between 0° and 180° (e.g., either 30° or 150° with the common major axis of the ellipses), (2) the spacing between the facing edges of the electrodes in either pair is 1-2 times the electrodes' edge dimension and the edge dimension is comparable to the piezoelectric film thickness, and (3) no two electrodes touch and electrically short. In FIGS. 1(*a*) and 1(*b*), the ratio of the distance between the facing edges of the electrodes in a pair to the lateral dimension of the electrodes is 1.67; this is true for electrode pair AA' and, separately, BB' as well. Different dimensions for one or more of the MTJ 101 elements, the first pair of electrodes AA', the second pair of electrodes BB', and the piezoelectric film 102 may be used in alternative embodiments provided the combination of elements satisfy the aforementioned features that will generate proper stresses in the magnet. In some aspects of the invention, the hard layer 104 of the MTJ 101 is a synthetic anti-ferromagnet (SAF) whose in-plane shape anisotropy energy barrier is so high that any transferred strain cannot perceptibly rotate its magnetization. When the magnetizations of the hard and soft layers 104 and 106 are parallel (e.g., state $\Psi_0$ in FIG. 1(*b*)), the stored bit is "0," and when they are anti-parallel (e.g., state $\Psi_1$), the stored bit is "1."

In order to write a bit (i.e., "1" or "0") to the memory element 100, the resistance of the MTJ 101 is first read to determine what the stored bit is. The bit is read by simply measuring the resistance of the MTJ between the soft magnetic layer 106 and hard magnetic layer 104 using, e.g., two terminals 108 and 109 attached to the hard 104 and soft 106 magnetic layers, respectively. High resistance indicates the stored bit is "1" and low resistance indicates the stored bit is "0", or vice versa.

As an example, consider the scenario of writing a bit "1". After reading what the stored bit is, if it is bit "1," no change is made to the MTJ 101. If the stored bit is read and it's "0," then the magnetization of soft layer 106 is at $\Psi_0$ and must be switched to $\Psi_1$ (FIG. 1(*b*)). To accomplish this, a voltage "V" is applied between the electrode pair AA' and the grounded n⁺-silicon substrate 103. The voltage V generates a biaxial strain in the piezoelectric layer 102 underneath the soft layer 106. This biaxial strain (compression/tension along the line joining the electrodes A and A' and tension/compression along the perpendicular axis) is transferred to the magnetostrictive magnet 106 by elastic coupling despite any substrate clamping and despite the fact that the electric field in the piezoelectric layer 102 just below the magnet 106 is approximately zero since the metallic magnet shorts out the field.

According to aspects of the exemplary memory element 100 and in continuation of the example of writing a bit "1", the magnetostriction coefficient of the soft layer 106 is positive and the applied voltage between AA' and ground (of the polarity shown in FIG. 1(*a*) by arrow 107) has generated compressive stress along the line connecting electrodes A and A' and tensile stress in the direction perpendicular to this line. In this case, the magnetization will rotate away from $\Psi_0$ towards $\Psi_1$. Once steady state is reached and the magnetization settles at some intermediate state $\Psi'$ which is roughly perpendicular to the axis joining the electrodes A and A', a voltage is applied between the electrode pair BB' and the grounded substrate 103 while the voltage at AA' is withdrawn (timing is not critical as long the voltage at AA' is not withdrawn before application of the voltage at BB'). This will rotate the magnetization farther towards $\Psi_1$. Finally, upon reaching the new steady-state at $\Psi''$ which is roughly perpendicular to the line joining the electrode pair BB', the voltage at electrode pair BB' is withdrawn (again, timing is not critical) and the magnetization vector will rotate spontaneously to the closer of the two global energy minima, which is now $\Psi_1$. Thus the result is flipping the magnetization and writing the desired bit "1." Writing bit "0," when the initial stored bit is "1," is accomplished by exactly the same steps, although the effect is a clockwise rotation of the magnetization of the soft layer 106 from $\Psi_1 \to \overline{\Psi'\Psi''} \to \Psi_0$. Note that a two-phase clock is generally required to flip the bit—one phase tied to electrode pair AA' and the other phase tied to electrode pair BB'.

In order to estimate the energy dissipated in writing the bit, the minimum time required to write, and the write error probability, stochastic Landau-Lifshitz-Gilbert calculations have been carried out. For the sake of simplicity, we always consider uniaxial strain along the line joining the two electrodes of a pair (AA' or BB'), but the strain is actually biaxial resulting in tension/compression along that line and compression/tension along the perpendicular direction. The torques acting on the magnetization vector due to these two components add and enforce each other. Therefore, per these example calculations, the torque that makes the magnetization vector rotate is underestimated, which makes dissipation, error probability, and switching delay calculations herein conservative.

Figure 2A:
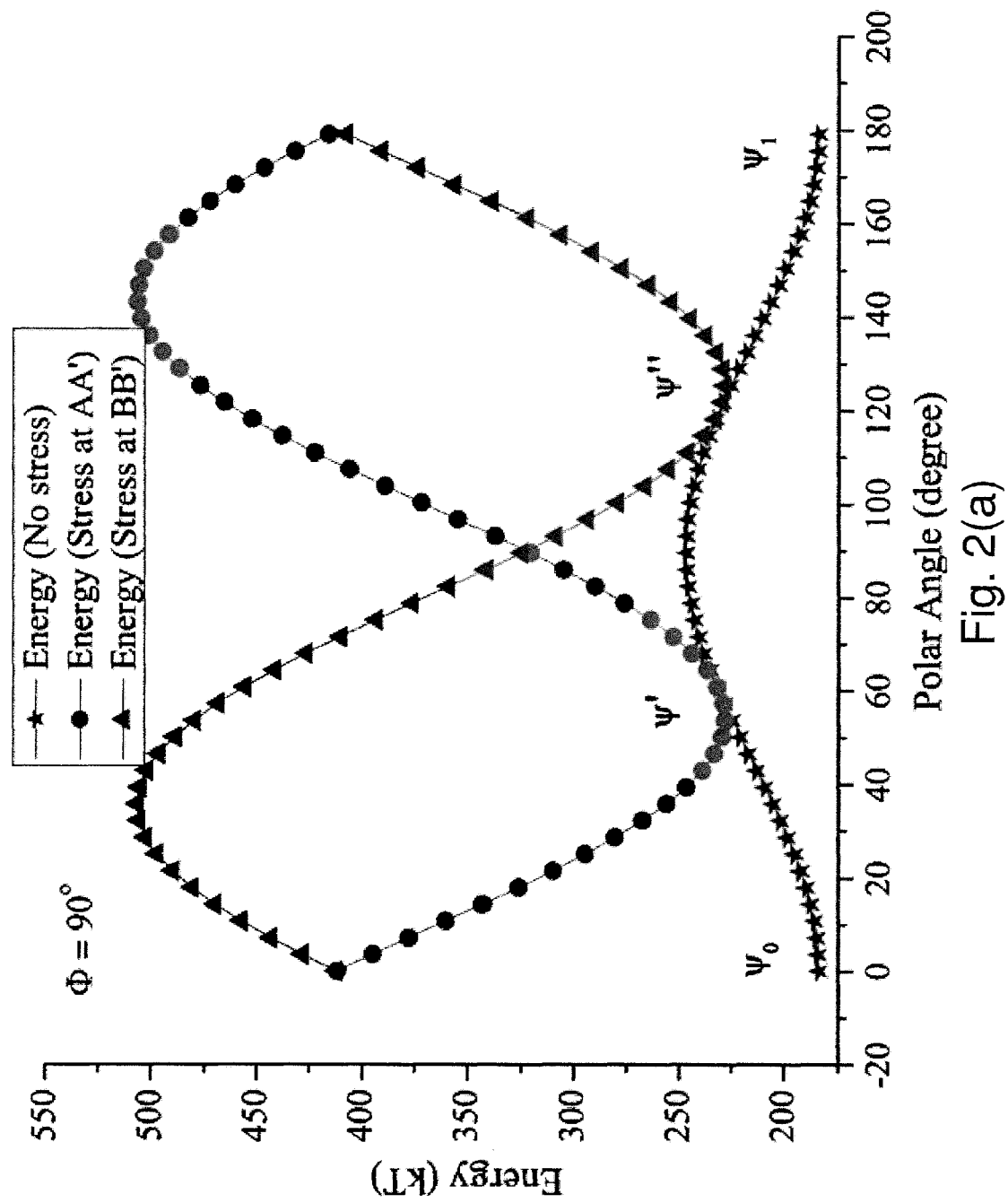
FIG. 2(a) shows potential energy profiles of a Terfenol-D magnetostrictive nanomagnet of stated dimensions when the magnetization vector is constrained to the plane of the magnet: $\Phi=90°$. The three curves show, respectively, the profiles when no electrode pair is activated, electrode pair AA' is activated, and electrode pair BB' is activated. Activating electrode pair AA' creates a global energy minimum at $\Psi'''$ ($\Phi=90°$), whereas activating pair BB' creates a global minimum at $\Psi'''=90°$).
Figure 2B:
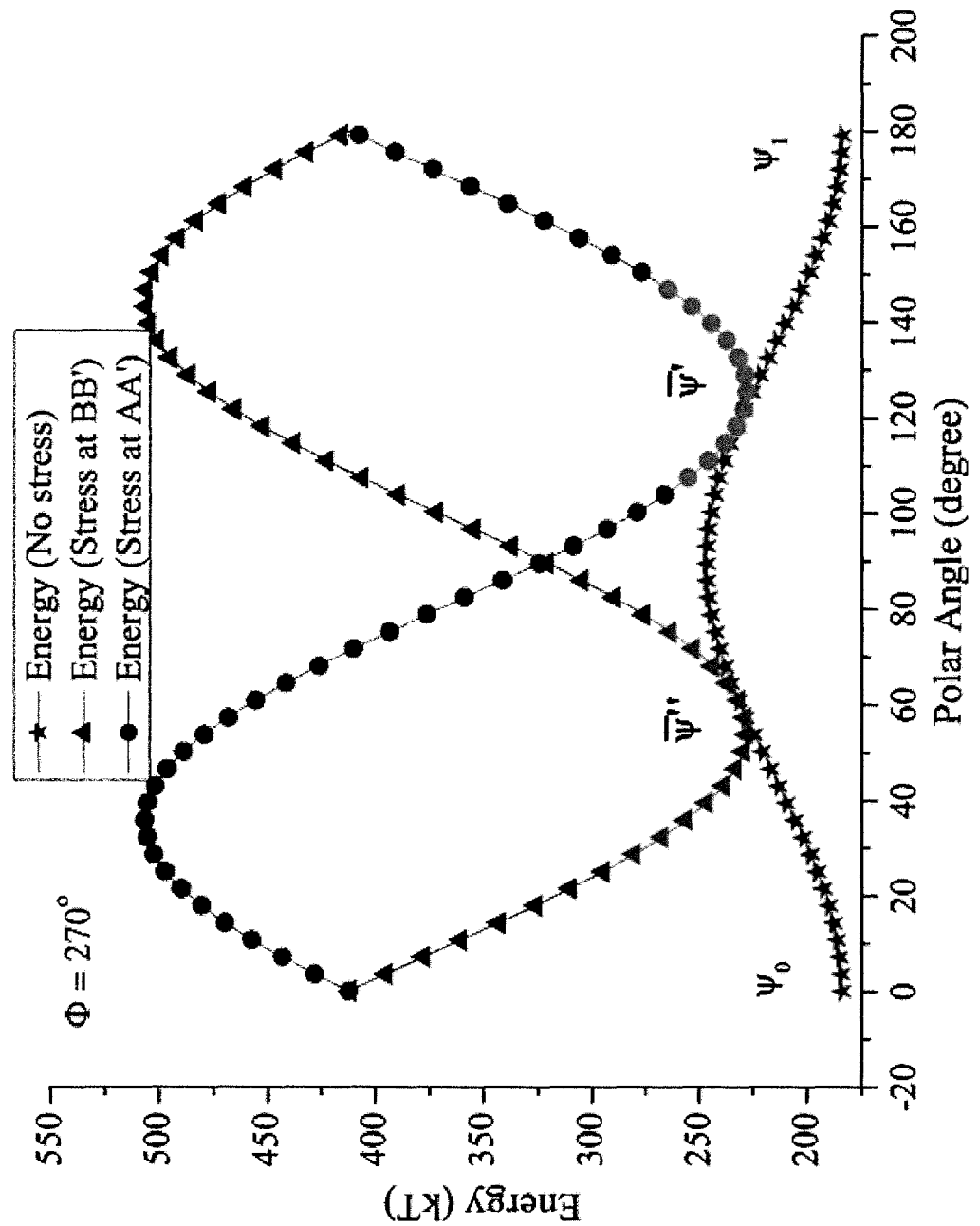
FIG. 2(b) shows potential energy profiles of a Terfenol-D magnetostrictive nanomagnet of stated dimensions when the magnetization vector is constrained to the plane of the magnet: $\Phi=270°$. The three curves show, respectively, the profiles when no electrode pair is activated, electrode pair AA' is activated, and electrode pair BB' is activated. Activating electrode pair AA' creates a global energy minimum at $\Psi'(\Phi=270°)$, whereas activating pair BB' creates a global minimum at $\Psi'''$ ($\Phi=270°$).

FIG. 2 shows a potential energy profile of the magnetostrictive nanomagnet 106 in the magnet's plane ($\Phi=90°$, 270°) as a function of the polar angle $\theta$ subtended by the magnetization vector with the common major axis of the elliptical hard and soft layers 104 and 106 (z-axis). The three profiles correspond to the situations when neither electrode pair is activated, electrode pair AA' is activated, and electrode pair BB' is activated, respectively.

Consider the case when the magnetization of the nanomagnet 106 is initially in the stable state $\Psi_0$ (e.g., initial stored bit is "0"). If the electrode pair AA' is activated, a compressive uniaxial stress component is generated along the line joining that electrode pair, which will rotate the magnetization vector to since that corresponds to the only accessible global energy minimum (see the energy profile corresponding to $\Phi=90°$ in FIG. 2). Although another global minimum exists at this minimum is inaccessible owing to the energy barrier between $\Psi_0$ and $\Psi'$ (see energy profile corresponding to $\Phi=270°$ in FIG. 2; the peak of the energy barrier separating $\Psi_0$ and $\Psi'$ is located roughly at $\theta=35°$). Thus, the magnetization will rotate clockwise instead of anti-clockwise in FIG. 1(b). Next, deactivating AA' and activating BB' causes a uniaxial compressive stress component along the line joining BB' that will rotate the magnetization clockwise to the new global energy minimum $\Psi'''$, which is the only accessible global energy minimum (the inaccessible minimum being $\overline{\Psi}'''$). Finally, removal of stress by deactivating BB' will drive the magnetization to $\Psi_1$ (writing the new bit "1") since it is the only accessible global energy minimum at that point. The other global energy minimum at $\Psi_0$ is inaccessible because of the energy barrier between $\Psi'''$ and $\Psi_0$. The height of this energy barrier is >20 kT which prevents the magnetization from migrating to $\Psi_0$ as opposed to $\Psi_1$.

If the electrode pairs are activated in the opposite sequence, i.e., BB' first and then AA' second, the magnetization will first rotate anti-clockwise from $\Psi_0$ to $\overline{\Psi}'''$, then anti-clockwise to $\overline{\Psi}'$, and finally anti-clockwise to $\Psi_1$ (see the energy profile corresponding to $\Phi=270°$). Therefore, the sequence does not matter; activating the electrode pairs in either sequence always flips the bit—either by clockwise rotation or anti-clockwise rotation depending on the sequence. This is true whether the bit is flipped from "0" to "1" or, alternatively, from "1" to "0".

Figure 3A:
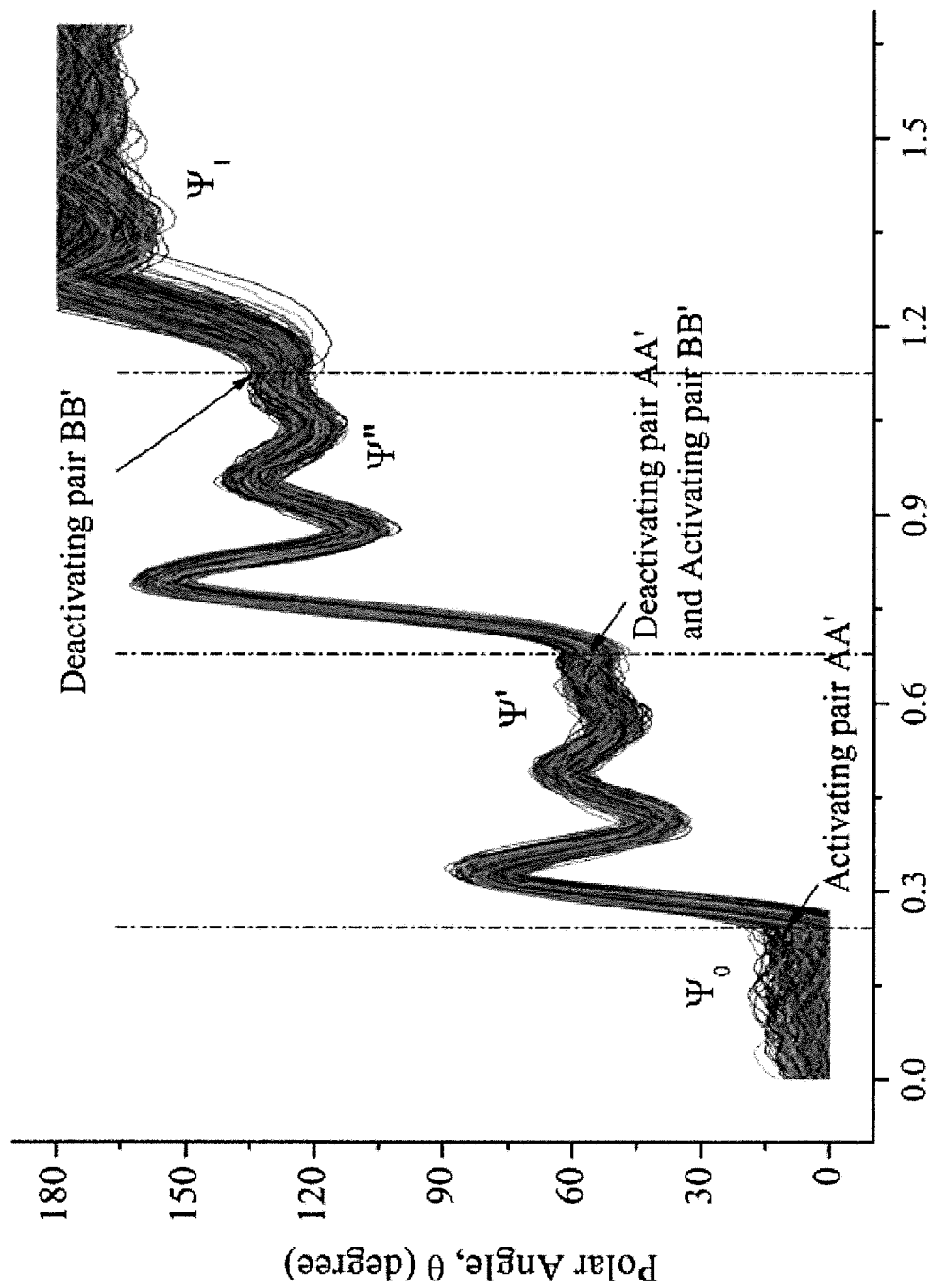
FIGS. 3(a) and 3(b) show magnetization dynamics at room temperature. Polar angles (FIG. 3(a)) and azimuthal angles (FIG. 3(b)) of 1000 randomly chosen trajectories out of $10^6$ trajectories plotted as a function of time. The trajectories are all slightly different from each other because of random thermal noise included in the simulation used to generate these trajectories. The instants at which the electrode pairs are activated and deactivated are shown.
Figure 3B:
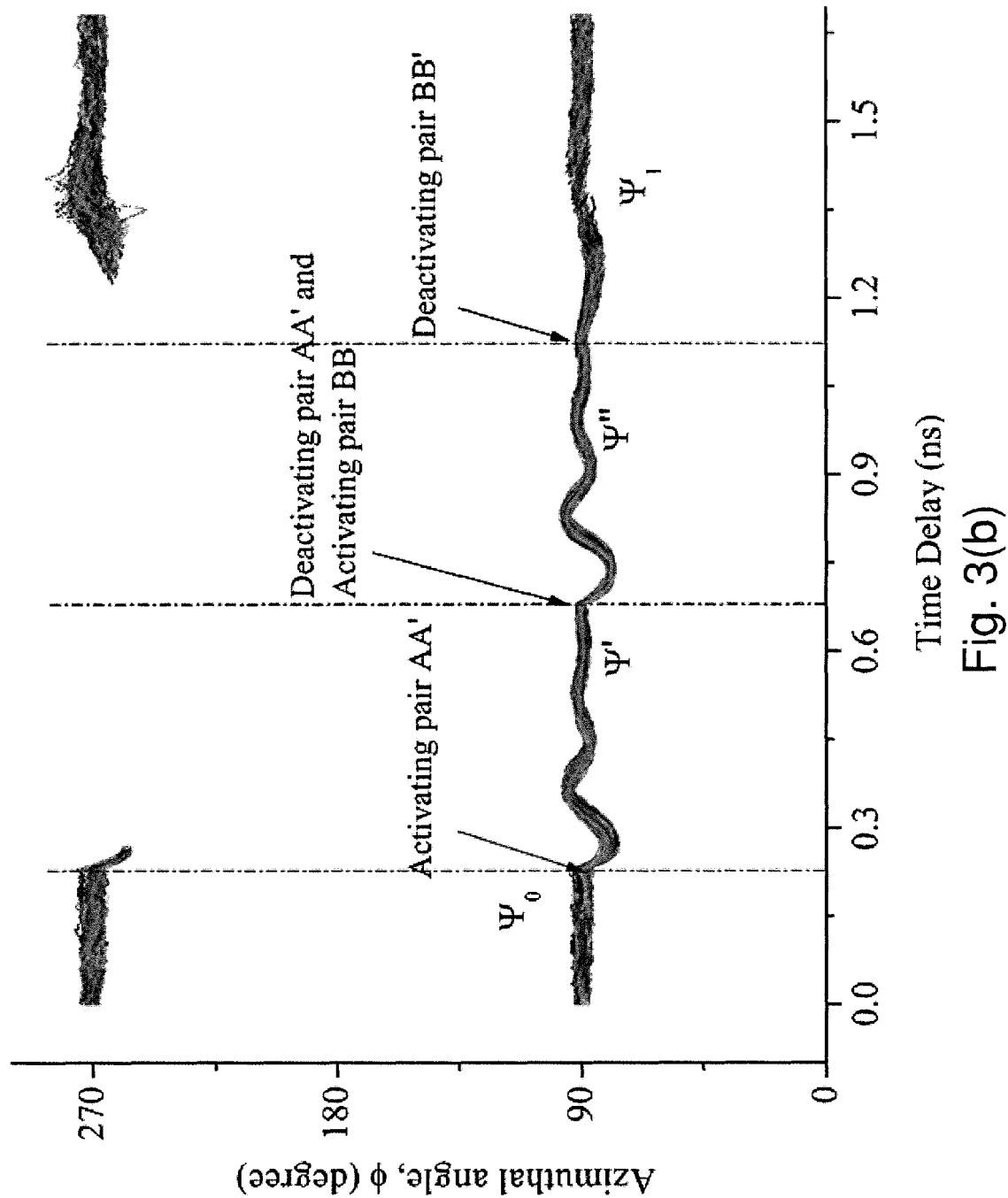

In FIG. 3, 1000 randomly chosen switching trajectories (magnetization orientation $\theta$, $\Phi$ versus time) are shown out of $10^6$ trajectories simulated in the presence of room temperature thermal noise. These switching trajectories are generated from stochastic Landau-Lifshitz-Gilbert simulations. The initial values of $\theta$ and $\Phi$ are chosen from their thermal distributions around $\theta=0°$ with appropriate weight, the fluctuation of the magnetization around the initial orientation is simulated for 2.3 ns, and then the pair AA' is activated (stress is turned on). The intermediate steady state $\Psi'$ ($\theta=60°\pm4°$) is reached by all $10^6$ trajectories within 0.45 ns after activation, at which point BB' is activated and then AA' is deactivated. The next intermediate steady state $\Psi'''$ ($\theta=120°\pm4°$) is reached by all trajectories within another 0.45 ns, and then BB' is deactivated (stress is turned off). The simulation of the trajectories is continued until for every one of the $10^6$ trajectories, $\theta$ reaches within 4° of 180° (successful flip). This takes another 0.46 ns. The trajectories in FIG. 3 are all slightly different from each other since they are probabilistic in the presence of room temperature thermal noise. One million trajectories were simulated (not all shown in the figures) and all of them showed successful transition from $\theta\approx0°$ to $\theta\approx180°$, implying that the switching failure probability is <$10^{-6}$. Therefore, the minimum switching delay for <$10^{-6}$ error probability is 0.45+0.45+0.46 ns=1.36 ns. This is the minimum time needed for all $10^6$ switching trajectories to complete flipping.

In order to avoid erroneously writing the wrong bit every time the stored bit happens to be the desired bit (since the stored bit is always flipped in the write step), a write cycle should include as a preliminary step a read step to determine the stored bit. If the stored bit is determined to be the same as the desired bit, no writing step is performed, thus no stress/strain is applied, and the magnetostrictive nanomagnet 106 is not flipped. Otherwise, the bit is flipped following the above described procedure. Although this requires an extra read step for every write step, it saves time and energy by obviating the write step whenever the stored and desired bits are the same. Since writing is both slower and more dissipative than reading, there may be an overall gain in efficiency for a plurality of write cycles comprising the 'read-followed-by write-if-needed' steps.

The write error probability may be made negligible by writing the bit when needed, then post-reading (i.e., verifying) it to verify if it was written correctly, re-writing it if it was written incorrectly, followed by another post-read and so on, until the bit is verified to have been written correctly. Alternatively, a fixed number of write-if-needed/verification steps may be carried out. The error probability after n such cycles of write-if-needed/verify is $10^{-6n}$ since it is the probability of having written the bit incorrectly n times in a row. It is overkill to reduce the write error probability to below the static error probability of $e^{-62.5}=10^{-27}$; hence just four (n=4) or fewer write-if-needed/verify cycles is sufficient. As a consequence of reducing the write error probability using verification steps, the write time increases. Even if the bit was written correctly in the first attempt, three additional idle cycles are still needed since all bits are written simultaneously in parallel. This will increase the effective write time to 1.36×4 ns=5.44 ns (again assuming that the read time is negligible compared to the write time), resulting in a clock rate of 180 MHz.

The results in FIG. 3 were generated assuming the following material parameters for the soft layer's 106 nanomagnet 106 made of Terfenol-D: saturation magnetization $M_s=8\times10^5$ A/m, magnetostriction coefficient $(3/2)\lambda_s=90\times10^{-5}$, Young's modulus Y=80 GPa, and Gilbert damping coefficient $\alpha=0.1$. Terfenol-D has one of the highest magnetostriction coefficients and a relatively high Young's modulus. Therefore, it requires relatively low strain for magnetization rotation. We also assume: strain $\in(t)=3.75\times10^{-4}$ (stress=30 MPa).

The electric field needed to generate a local strain of ~$10^3$ in the magnet was 3 MV/m. Using a linear interpolation, the electric field needed to generate a strain of $3.75\times10^{-4}$ would be 1.125 MV/m. Therefore, the potential that needs to be applied to each of the electrode pairs AA' and BB' is 1.125 MV/m×100 nm=112.5 mV.

The energy dissipated in writing the bit has two components: (1) the "internal" dissipation in the magnetostrictive nanomagnet 106 due to Gilbert damping, and (2) the "external" (½)$CV^2$ dissipation associated with applying the voltage between the electrode pair AA' (or BB') and the grounded substrate which act as a capacitor. Since the piezoelectric response of PZT is much faster than the magnet switching, the strain generation may be viewed as instantaneous.

The larger electrodes A and A' have a lateral dimension of 120 nm, and the piezoelectric film 102 made of PZT has a thickness of 100 nm. Therefore, the capacitance associated with activation of a single electrode, A or A', is C=1.275 fF, if it's assumed that the relative dielectric constant of PZT is 1000. Since the two electrodes of a pair are always activated together, the external energy dissipation will be twice (½) $CV^2$ dissipation, and that value is 3896 kT at room temperature (V=112.5 mV). The smaller electrode pair BB' has a lateral dimension of 80 nm and hence a smaller capacitance of 0.567 fF per each individual electrode, B or B'. Consequently the electrode pair BB' dissipates $CV^2$ energy of 1733 kT. The mean internal dissipation could depend on whether the initial stored bit was "0" or "1," and we will take the higher value. In this case, the higher value was 514 kT, thus making the total dissipation 6143 kT which is at least three orders of magnitude less than what spin-transfer-torque memory (STT-RAM) dissipates in a write cycle since STT-RAM typically dissipates 10 million kT.

A scheme that also uses four different electrodes to rotate the magnetization of a magnetostrictive magnet with electrically-generated strain has appeared in print (C-Y Liang, et al. "Electrical control of a single magnetoelastic domain structure on a clamped piezoelectric thin film—analysis", J. Appl. Phys. 116, 123909 (2014)). The magnet's magnetization in this case has two stable orientations that are mutually perpendicular. Activating one pair of electrodes switches the magnetization to one stable orientation and activating the other switches it to the other stable orientation. Liang et al. teach only how to rotate the magnetization by up to only 90° with strain. This was also taught in (N. Tiercelin, et al., J. Appl. Phys. 109, 07D726 (2011)). It does not teach how to "flip" the magnetization, i.e., rotate it by complete 180°. The complete 180° rotation is far superior to 90° rotation since that allows the MTJ on-resistance to be significantly different from the off-resistance. Having two stable orientations which are 180° apart maximizes the difference between the two resistances of the MTJ associated with the two stable orientations. That, in turn, provides for much better noise tolerance when the bit is read.

The previous discussion described a non-volatile magneto-elastic "memory" element. The ensuing discussion pertains to a non-volatile magneto-elastic universal NAND "logic gate". As mentioned earlier, the described NAND gate is configurable into a NOR gate by changing the shape of the magnetic layers. For simplicity, an exemplary NAND gate will be the focus of an exemplary embodiment described next. To reconfigure the NAND gate into a NOR gate, one can reduce the shape anisotropy of the soft layer (e.g. by making the ellipse less eccentric) so that a smaller amount of stress is able to rotate the magnetization. In that case, the strain produced by either one of the input voltages being high would be sufficient to rotate the magnetization and result in the NOR operation. On the other hand, if the shape anisotropy of the magnet is increased (e.g. by making the ellipse more eccentric), then the strain produced by just one input voltage being high would not be sufficient to rotate the magnetization, but the strain produced by both input voltages being high would be sufficient. In that case, the NAND operation will result.

Figure 4A:
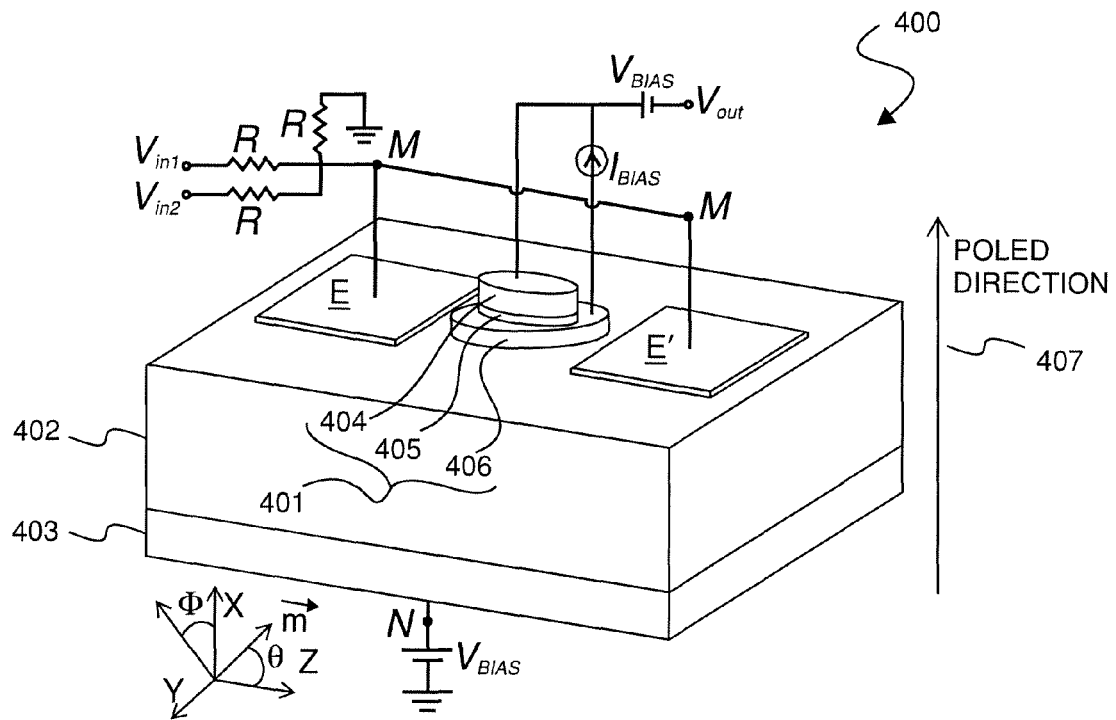
FIG. 4(a) is a schematic of an exemplary logic gate according to an isometric view.

FIG. 4(a) shows a proposed gate structure 400. It comprises a skewed MTJ stack 401, resistors R, a bias dc voltage $V_{BIAS}$, and a constant current source $I_{BIAS}$. The MTJ stack 401 is arranged on a piezoelectric layer 402 (e.g., PZT thin film) atop a silicon substrate 403. The substrate 403 may be any conducting substrate on which a piezoelectric material (such as but not limited to PZT, PMN-PT, Lead Niobate, etc.) can be deposited. Alternatively, the substrate 403 may be a nonconducting material, in which case an additional conducting layer (not shown in FIG. 4(a)) is interposed between the substrate 403 and the piezoelectric layer 402. Generally, substrate 403 will have a greater thickness than what is shown in FIG. 4(a), the drawing having a reduced thickness for simplicity of illustration. The current source $I_{BIAS}$ is not used to switch the gate 400, but merely to produce an output voltage $V_{out}$ representing the output logic bit. Input bits are encoded in input voltages, $V_{in1}$ and $V_{in2}$. Both input and output bits are encoded in the same physical quantity, namely voltage, which advantageously allows direct concatenation.

The (bottom) soft layer 406 of the MTJ stack is a magnetostrictive (metallic) nanomagnet (e.g., Terfenol-D) and the (top) hard layer 404 is a non-magnetostrictive (metallic) synthetic antiferromagnet (SAF) with large shape anisotropy. The top hard layer 404 acts as the hard (or pinned) layer and the bottom soft layer 406 acts as the soft (or free) layer of the MTJ 401. The layers 404 and 406 are separated by a thin insulating spacer layer 405. Both layers 404 and 406 have magnetizations with two stable orientations. In some exemplary embodiments, each layer is elliptical in shape. Alternative embodiments may have layers 404 and/or 406 which are elliptical, rectangular, parallelogrammatic, or of any other shape having two stable magnetic orientations. In FIG. 4(a), the arrow labeled 'm' next to the coordinate system indicates any arbitrary orientation of the magnetization vector of the soft layer 406.

In some exemplary embodiments, the soft layer 406 consists entirely of the magnetostrictive nanomagnet. As a result, descriptions herein such as "magnetization orientation", magnetization "state", or other qualities or characteristics may be made with respect to the soft layer 406 or the magnetostrictive nanomagnet, the two nouns generally referring to the same structural element. As such, for exemplary embodiments discussed herein, the numeric identifier "406" may be used with a few interchangeable names for the same structural element of the MTJ 401, including but not limited to "soft layer", "soft magnetic layer", "magnetostrictive nanomagnet", "magnetostrictive magnet", "nanomagnet", "soft magnet", or simply "magnet" (but not "hard magnet"). On a similar note, in some exemplary embodiments, hard layer 404 consists entirely of the hard magnet of the MTJ 401. Context will also make apparent to one of ordinary skill in the art whether a given description refers to the magnetostrictive nanomagnet/soft layer 406, or the hard magnet/hard layer 404.

There is a small permanent magnetic field B directed along the hard axis (e.g., minor axis of an ellipse) of the magnetostrictive nanomagnet 406 (+y-direction) which brings its two stable magnetization orientations out of the original easy axis (e.g., major axis of an ellipse) and aligns them along two mutually perpendicular in-plane directions that lie between the original easy and hard axes (FIG. 1(b)). The permanent magnetic field B is provided by a magnetic field source which may be, for example, one or more permanent magnets 408 that are placed either on-chip or off-chip. Permanent magnets 408 are shown schematically in FIG. 4(b). The magnetic flux density generated by the permanent magnets 408 may have a strength between 0.1 and 1 Tesla, although higher and lower strengths are possible if the shape of the magnet is changed to accommodate a stronger or weaker field. The same magnetic field can also be generated with a combination of permanent magnets and the dipole field due to the hard layer acting on the soft layer. The easy axis (e.g., a major axis of an ellipse) of the top hard layer 404 is aligned along one of the two stable magnetization orientations of the bottom soft layer 406 subject to the permanent magnetic field B. The hard layer 404 is permanently magnetized in the direction anti-parallel to that orientation. Note that "anti-parallel" means two orientations are collinear with the additional requirement that they be in opposite directions (i.e., having directions which differ by substantially 180°). "Parallel", as used herein, means that the two orientations are collinear and have the same direction (i.e., having directions which differ by substantially 0°).

Two electrodes E and E' are arranged on the surface of the piezoelectric layer 402 preferably in such a way that a line LE joining their centers is substantially parallel with the orientation of an easy axis of the hard layer 404. In an exemplary embodiment, the electrodes' lateral dimensions (e.g., width and length), the separation between their edges which face one another, and the piezoelectric film thickness are all approximately equal. The piezoelectric film may be, e.g., a PZT film.

The two electrodes E and E' are electrically shorted. Whenever an electrostatic potential difference appears between the electrode pair EE' and the silicon substrate 403 (e.g., between node-M and node-N in FIG. 4(a)), the piezoelectric layer 402 is strained. Since the electrode in-plane dimensions are comparable to the piezoelectric film thickness, the out-of-plane ($d_{33}$) expansion/contraction and the in-plane ($d_{31}$) contraction/expansion of the piezoelectric regions underneath the electrodes E and E' produce a highly localized strain field under the electrodes. Furthermore, since the electrodes are separated by a distance approximately equal to the piezoelectric layer film thickness, the interaction between the local strain fields below the electrodes leads to a biaxial strain in the piezoelectric layer 402 underneath the soft magnet of bottom soft layer 406. This biaxial strain (compression/tension along the line joining the electrodes E and E' and tension/compression along the perpendicular axis) is transferred to the soft magnetostrictive magnet 406 in elastic contact with the piezoelectric layer 402, causing a rotation of its magnetization. This occurs despite any substrate clamping and despite the fact that the electric field in the piezoelectric layer 402 just below the magnet is approximately zero. Some of the generated strain may reach the hard magnet of the top hard layer 404, but since the hard magnet is very anisotropic in shape and is not magnetostrictive, its magnetization will not rotate perceptibly.

Figure 4B:
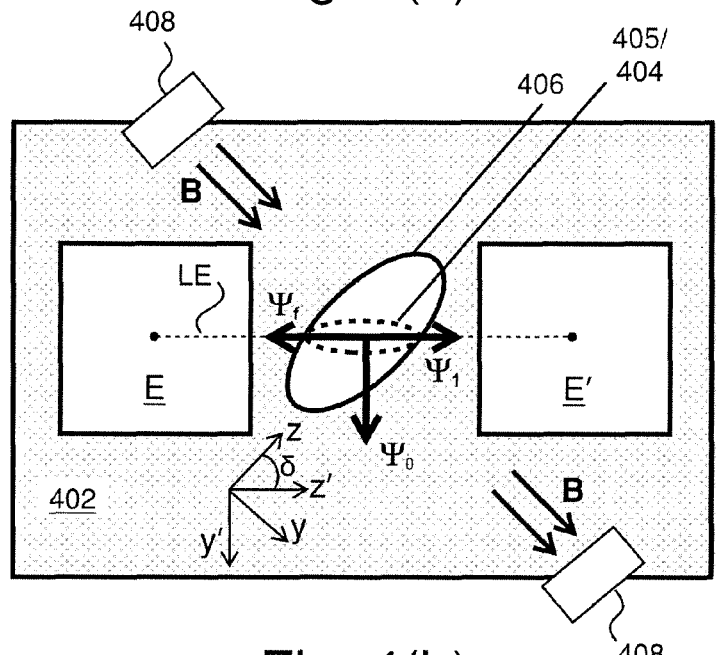
FIG. 4(b) is the schematic of FIG. 4(a) according to a top view of the gate.
Figure 5:
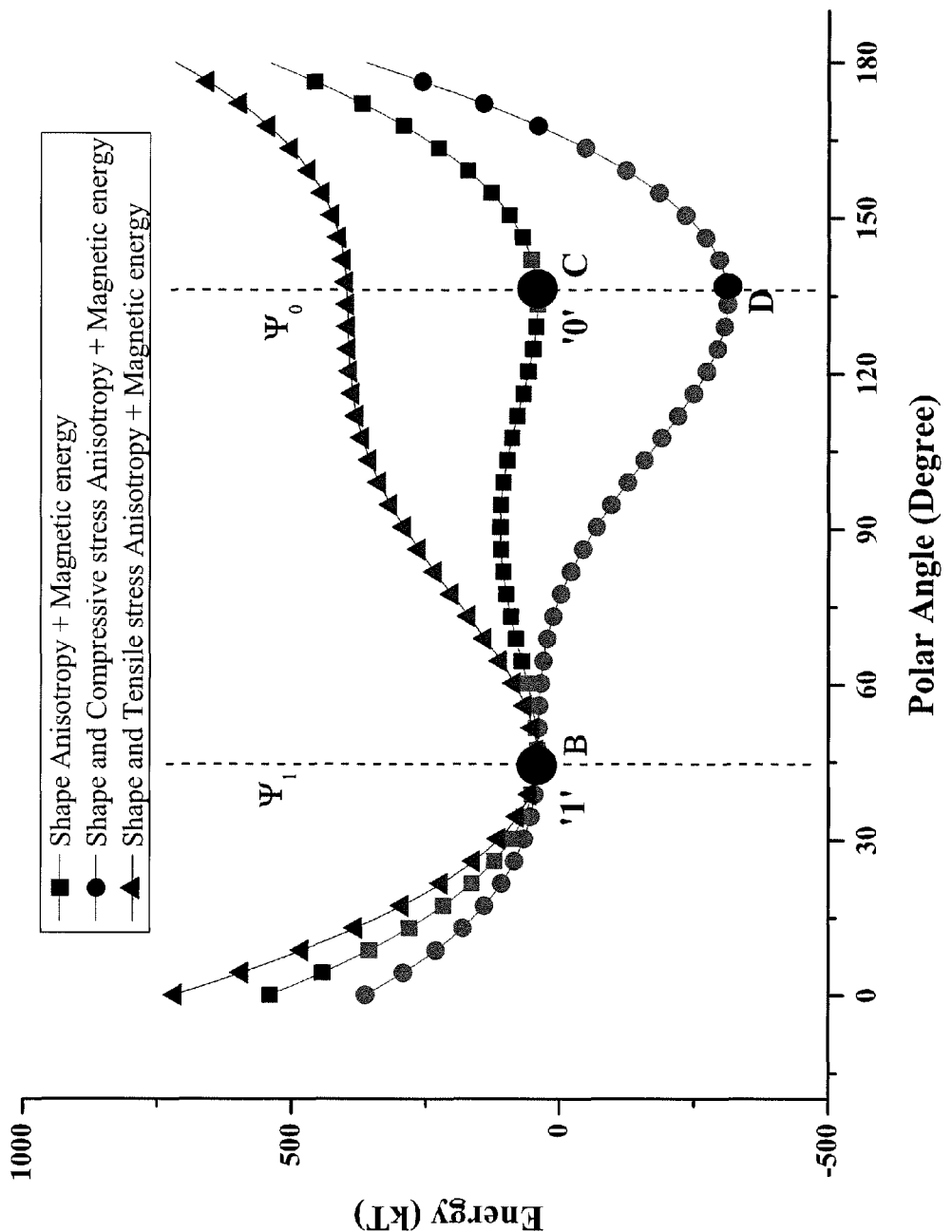
FIG. 5 shows potential energy profiles of the magnetostrictive layer in FIGS. 4(a) and 4(b) as a function of its magnetization orientation. Energy plot as a function of polar angle ($\theta$) of the magnetization vector, where the line using square points is for the unstressed magnet, the line using circle points is for the compressively stressed magnet (−30 MPa), and the line using triangle points is for the expansively stressed magnet (+30 MPa). The voltage levels between M and N that generate these stresses are ±112.5 mV.

FIG. 5 shows the potential energy profile of the soft magnetostrictive nanomagnet 406 in its own plane ($\Phi=90°$) plotted as a function of the angle $\theta$ subtended by the magnetization vector with the major axis of the ellipse of the nanomagnet 406 (z-axis). Note that the energy profile has two degenerate minima (B and C) in the absence of stress (i.e. when no voltage is applied between nodes M and N). These two states, B and C, correspond to $\Psi_1$ and $\Psi_0$, respectively, in FIG. 4(b). Application of sufficient potential difference between M and N, to generate sufficient stress in the magnetostrictive magnet 406, transforms the energy profile into a monostable well (with no local minima) located at either B or D, depending on whether the stress is tensile or compressive, i.e., whether node M is at a higher potential than node N or node M is at a lower potential than node N. If compressive stress is applied with the right voltage polarity, the system will go to point D and the magnetization will point along the direction corresponding to point D. Thereafter, if the voltage and stress are withdrawn, the system will go to the nearer energy minimum. Starting at point D, the nearer energy minimum is at point C (and not the other minimum at B) because of the potential barrier that exists between B and C. The transition from point D to point C happens with >99.999999% probability at room temperature in the presence of thermal noise. Once the magnetization reaches C, the system will remain at C (since it is an energy minimum) and the magnetization of nanomagnet 406 will continue to be oriented in state $\Psi_0$ (making the device non-volatile) until tensile stress is applied (e.g., by applying voltage of opposite polarity between M and N) to take the system to B, thereby changing the magnetization to the other stable direction, $\Psi_1$. Once the magnetization is oriented in the direction $\Psi_1$, upon withdrawal of the tensile stress, the system will remain at B because the energy barrier between B and C will prevent it from migrating to C. Therefore, the system is non-volatile in either state, B or C.

Simply by selecting the polarity of the voltage between nodes M and N, it is possible to make the system deterministically visit either state B or state C and orient the magnetization along either of the two stable states, $\Psi_1$ and $\Psi_0$, respectively. The nanomagnet 406 will remain in the chosen state after the voltage is withdrawn. This is used as the basis for deterministically writing the bit, 0 or 1, in non-volatile memory, irrespective of the initial stored bit.

Figure 6B:
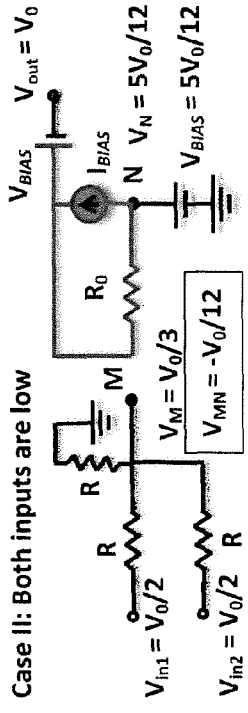
FIGS. 6(a) to 6(d) show schematics for different logic input scenarios for the gate depicted in FIGS. 4(a) and 4(b)
Figure 6D:
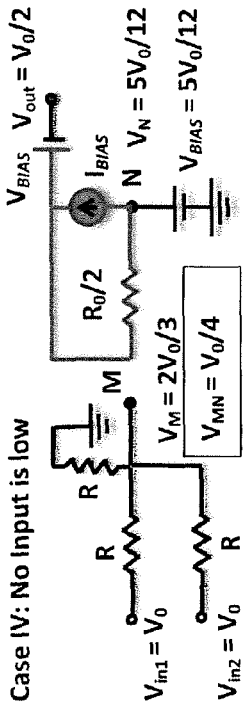
Figure 6A:
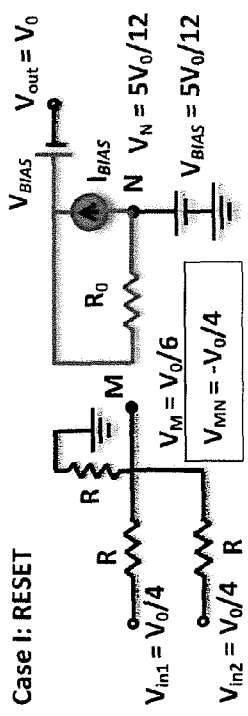
Figure 6C:
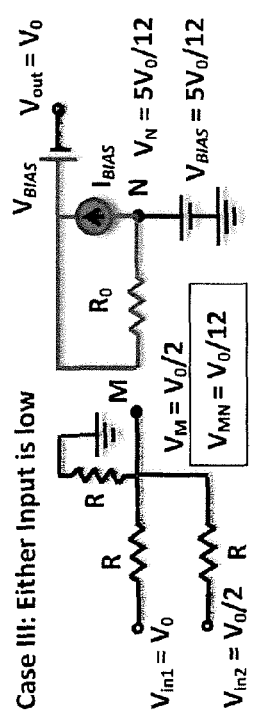

According to an aspect of the invention, a gate 400 may be operated as an NAND gate as follows. The binary logic bits "1" and "0" are encoded in voltage levels $V_0$ and $V_0/2$, respectively. The bias voltage is set to $V_{BIAS}=5V_0/12$. Every logic operation is preceded by a RESET operation which sets the resistance $R_{MTJ}$ of the MTJ 401 to a high state (represented herein as either '$R_0$' or '$R_{high}$', these being interchangeable), this state being characterized by the condition that the magnetizations of the hard layer 104 and the soft layer 106 are substantially anti-parallel. The two input voltages, $V_{in1}$ and $V_{in2}$, are set to a predetermined value, in this case $V_0/4$ (FIG. 6(a)). The voltage at node M with respect to ground may be calculated by superposition and is $V_0/6$. Since the bias voltage $V_{BIAS}$ is set to $5V_0/12$, the voltage at node N is fixed at $5V_0/12$. Thus, during RESET, the voltage drop/potential difference $V_{MN}$ appearing between the nodes M and N across the piezoelectric film 402 in FIG. 4(a) is $V_{MN}=-V_0/4$. The negative voltage stresses/strains the piezoelectric film 402. This strain is transferred to the magnetostrictive nanomagnet 406 resulting in in-plane tensile stress along a direction parallel with the line LE joining the centers of the two electrodes E and E' and in-plane compressive stress in the in-plane direction perpendicular to line LE. This moves the system to state B in the energy profile in FIG. 5 (or keeps the system at state B if this is the initial state prior to the start of the RESET operation). At state B, the magnetization vector of the soft layer 406 is nearly/substantially anti-parallel to the magnetization of the hard magnet (e.g., SAF) of the top hard layer 404. That is to say, the magnetization vector of the soft layer 406 is substantially oriented in the direction $\Psi_1$. (It is not necessary that the magnetization vector of the soft layer be exactly anti-parallel to the magnetization of the hard layer.) This makes the resistance of the MTJ 401 'high'. When the input voltages $V_{in1}$ and $V_{in2}$ are subsequently withdrawn by, for example, grounding the inputs, $V_{MN}$ drops nearly to zero provided resistors R are of much greater resistance than the resistance of the piezoelectric layer 402. As a result of $V_{MN}$ substantially dropping to zero, the stress in the magnet 406 relaxes, but the system remains at state B (with the magnetization oriented substantially along $\Psi_1$). Consequently, the MTJ 401 is always left in the high resistance state after the RESET step is completed. By applying Kirchoff's voltage law in the output loop (FIG. 6), one arrives at $$V_{out} = -V_{BIAS} + I_{BIAS}R_{MTJ} + V_{BIAS} = V_0 \frac{R_{MTJ}}{R_0}, \quad \text{(Equation 1)}$$

since $I_{BIAS}$ is set to $V_0/R_0$. Because $R_{MTJ}=R_0$ after the RESET stage, $V_0,=V_0$.

In the logic operation stage, the following scenarios may occur: (1) both inputs are low (e.g., $V_{in1}=V_{in2}=V_0/2$, so $V_{MN}=V_0/12$); (2) either but not both inputs are low (e.g., $V_{in1}=V_0$ and $V_{in2}=V_0/2$, or vice versa, so $V_{MN}=V_0/12$); and (3) both inputs are high (e.g., $V_{in1}=V_{in2}=V_0$, so $V_{MN}=+V_0/4$).

Figure 7:
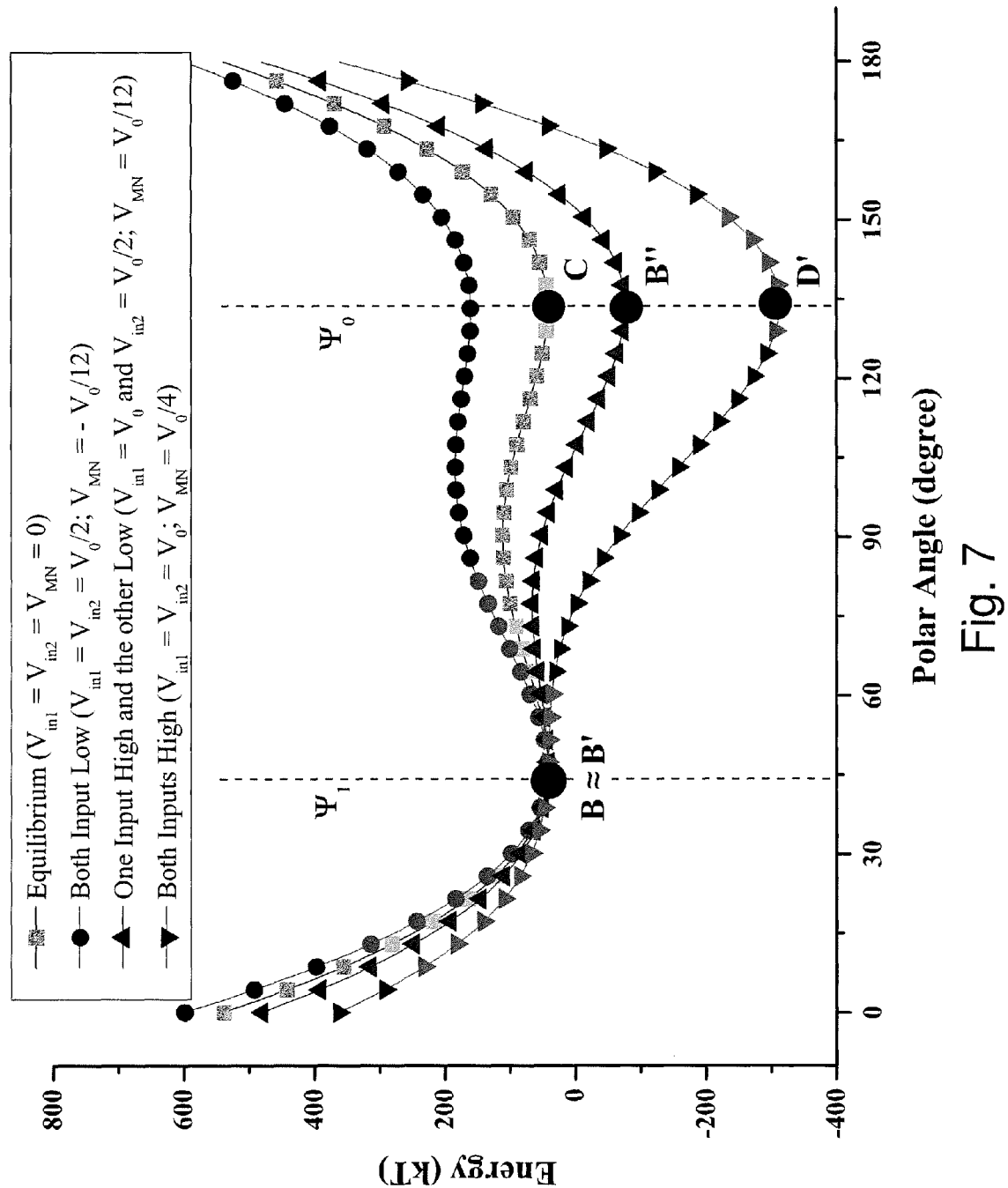
FIG. 7 shows potential energy profiles of the magnetostrictive layer in FIGS. 4(a) and 4(b) for different logic inputs. The potential energy is plotted as a function of polar angle ($\theta$) of the magnetization vector.

These three scenarios as well as a RESET operation are illustrated schematically in FIGS. 6(a) to 6(d). The potential energy profiles for these scenarios are shown in FIG. 7.

When both inputs are low, $V_{in1}=V_{in2}=V_0/2$, therefore $V_M$ (i.e., the voltage at node M with respect to ground) is $V_0/3$ and $V_{MN}$ is $-V_0/12$. This negative voltage causes tensile stress in the magnetostrictive nanomagnet 406 and produces a global energy minimum at B'≈B (FIG. 7). Since the RESET operation left the system at state B (i.e., magnetization of soft magnet 406 in orientation $\Psi_1$), the magnetization vector of the nanomagnet 406 barely rotates (i.e., it does not rotate or rotates by an insubstantial amount), the magnetizations of the hard and soft layers 404 and 406 of the MTJ 401 remain anti-parallel, and the resistance of the MTJ 401 remains high. Therefore, from Equation 1, $V_{out}=V_0$. In other words, when both inputs are bit "0", the output is bit "1".

When one input is high and the other low, $V_{in1}=V_0/2$ and $V_{in2}=V_0$ (or equivalently, $V_{in1}=V_0$ and $V_{in2}=V_0/2$), making $V_M=V_0/2$ and $V_{MN}=V_0/12$. This positive voltage causes a compressive stress in the magnetostrictive nanomagnet 406 but is insufficient in magnitude to rotate the magnetization vector of the nanomagnet 406 by overcoming the shape anisotropy energy barrier of the elliptical magnet. The global energy minimum is B" (FIG. 7) which is closer to the stable magnetization orientation $\Psi_0$. However, there is still a local energy minimum close to B (i.e. approximately at state B). As shown in FIG. 7, a potential energy barrier separates minima B and B" which the system is incapable of crossing. As a result, the system remains stuck in the metastable state corresponding to the local minimum near B and the magnetization of magnet 406 does not rotate perceptibly. Hence, once again, the resistance of MTJ 401 remains high and the output voltage remains $V_{out}=V_0$. In other words, when one input bit is "1" and the other input bit is "0", the output is bit "1". After the inputs are removed (e.g., by grounding $V_{in1}$ and $V_{in2}$), the strain in the magnet 406 relaxes and the magnetization settles into the only accessible stable state, namely state B. It remains there in perpetuity thereby implementing non-volatile logic (i.e., memory of the last output state is retained).

When both inputs are high, $V_{in1}=V_{in2}=V_0$. In that case, $V_M=2V_0/3$, and $V_{MN}=+V_0/4$. This stresses/strains the piezoelectric layer 402 and, by elastic contact, the magnetostrictive nanomagnet 406. The strain in the nanomagnet 406 becomes in-plane compressive in the direction parallel with the line LE joining the centers of the two electrodes E and E' and in-plane tensile in the direction perpendicular to the line joining the two electrodes. The stress/strain generated by the magnitude of the positive voltage of $V_{MN}$ is sufficient to overcome the shape anisotropy barrier and change the potential energy profile. Now, the global energy minimum becomes D' (FIG. 7). The system moves to D' since there is no local minimum where the system can get stuck. In other words, there is no energy barrier between states B and D' that prevents the system from shifting all the way from state B to state D' once the global energy minimum has become D'. Consequently, the magnetization vector of magnet 406 rotates ~90° to an orientation nearly perpendicular to the magnetization of the top hard layer 404. Specifically, the magnetization rotates to state '$\Psi_0$' in FIG. 4(b). The resistance of the MTJ 401 then drops by ~50% (i.e., to $R_0/2$) since the resistance is approximately proportional to $\cos^2(\gamma/2)$, where γ is the angle between the magnetizations of the magnets of the hard layer 404 and soft layer 406, provided that the spin injection and detection efficiencies of the magnet-spacer interfaces are ~100% (if the efficiencies are less than 100%, the logic levels will be encoded in $V_0$ and $xV_0$, where x>0.5). From Equation 1, the output voltage drops to $V_0/2$. Thus, when both inputs are bit "1", the output is bit "0". Subsequent removal of the input voltages $V_{in1}$ and $V_{in2}$ (e.g., by grounding them), drives the system to state C where the resistance of MTJ 401 remains low, thereby retaining memory of the last output state (i.e., thus exhibiting non-volatility).

In order to choose the value of $V_0$ (which ultimately determines the amount of dissipation, switching delay and energy-delay product), the compressive stress generated by $V_{MN}=V_0/4$ needs to be sufficient to overcome the shape anisotropy barrier in the soft layer 406 (which may be, e.g., elliptical) and rotate its magnetization. However, compressive stress generated by $V_{MN}=V_0/12$ needs to be insufficient to overcome the barrier. In short, there is a predetermined threshold for compressive and/or tensile stress/strain. When the threshold (whether for tensile or compressive stress or strain) is exceeded, the magnetization vector of the soft layer 406 is driven to the appropriate stable orientation. Compressive strain which exceeds a first threshold causes the magnetization vector of the soft layer 406 to maintain or rotate to one of the two stable orientations, and tensile strain which exceeds a second threshold causes the magnetization vector to maintain or rotate to the other of the two stable orientations. If a threshold is not exceeded, the magnetization vector does not flip. The thresholds are determined by the shape anisotropy, material composition, and processing (i.e., the growth/manufacturing method) of the soft magnetic layer 406 as well as the magnitude and direction of the permanent magnetic field B. The amount of stress generated by a certain voltage, and the effective shape anisotropy barrier in the presence of the permanent magnetic field B, depend on many parameters such as the strength of the magnetic field B, the shape and size of the magnetostrictive nanomagnet 406, the electrode size of E/E' and their placement, the thickness of piezoelectric layer 402, and the piezoelectric and magnetostrictive materials. For the exemplary choices made for the calculations and descriptions herein, it was found from stochastic Landau-Lifshitz-Gilbert simulations of magnetodynamics in the presence of room-temperature thermal noise that a compressive stress of 30 MPa rotates the magnetization with greater than 99.999999% probability (and switches the MTJ resistance from high to low) in the presence of room-temperature thermal fluctuations, while a compressive stress of 10 MPa has less than $10^8$ probability of rotating the magnetization and switching the MTJ resistance. Therefore, in this exemplary illustrative embodiment, $V_{MN}=V_0/4$ needs to generate a stress of −30 MPa (compressive strain is negative). The material chosen for the magnetostrictive material is Terfenol-D because of its large magnetostriction. From the Young's modulus of Terfenol-D, it was calculated that the strain required to generate a stress of −30 MPa is $-3.75\times10^{-4}$. To generate this amount of strain, the strength of the electric field in the PZT (of the piezoelectric layer 402) between the shorted electrodes E/E' and the $n^+$-Si substrate should be 1.125 MV/m. This value is well below the breakdown field of PZT. Since the PZT layer thickness is 100 nm, the voltage $V_{MN}$ needed to generate the strain of $-3.75\times10^{-4}$ will be 112.5 mV. Hence, $V_0=4V_{MN}=0.45$ V in this exemplary embodiment.

The error probability associated with operation of a gate 400, the internal energy dissipated during switching, and the switching delay—all in the presence of room-temperature thermal noise—is calculated from stochastic Landau-Lifshitz-Gilbert simulations of the magnetization dynamics, and that probability was found to exceed 99.999999% in all cases. First, expressions are written for the various contributions to the potential energy of the magnetostrictive layer. Then the effective torques due to these contributions are found as well as the random torque due to thermal noise. These torques rotate the magnetization vector. The entire procedure is described next.

As shown in FIGS. 4(a) and 4(b), the coordinate system is defined such that the soft magnet's easy (major) axis lies along the z-axis and the in-plane hard (minor) axis lies along the y-axis. Application of a positive or negative voltage between the electrode pair and the conducting n$^+$-Si substrate (i.e., application of a non-zero voltage $V_{MN}$) generates biaxial strain leading to compression/expansion along the z'-axis and expansion/compression along the y' axis. The latter two axes are the axes of $\Psi_1$ and $\Psi_0$, as is apparent in FIG. 4(b). The angle between the z- and z'-axes is $\delta$, which is therefore the angle between the major axes of the hard and soft layers.

To derive general expressions for the instantaneous potential energies of the nanomagnet due to shape-anisotropy, stress-anisotropy, and the static magnetic field, the primed axes of reference (x', y', z') were used and the magnetization orientation of the single-domain magnetostrictive magnet was represented in spherical coordinates with θ' representing the polar angle and Φ' representing the azimuthal angle. The magnitude of the magnetization is invariant in time and space owing to the macrospin assumption. Note that the symbols "Φ" and "φ" are used interchangeably herein.

Using the rotated coordinate system (see FIG. 4(b)), the shape anisotropy energy $E_{sh}(t)$ of the nanomagnet can be written as, $$E_{sh}(t) = E_{s1}(t)\sin^2\theta'(t) + E_{s2}(t)\sin2\theta'(t) + \quad \text{(Equation 2)}$$
$$\frac{\mu_0}{2}\Omega M_s^2(N_{d-yy}\sin^2\delta + N_{d-zz}\cos^2\delta)$$
$$E_{s1}(t) = \left(\frac{\mu_0}{2}\right)\Omega M_s^2\{N_{d-xx}\cos^2\phi'(t) + N_{d-yy}\sin^2\phi'(t)\cos^2\delta - N_{d-yy}\sin^2\delta + N_{d-zz}\sin^2\phi'(t)\sin^2\delta - N_{d-zz}\cos^2\delta\}$$
$$E_{s2}(t) = \left(\frac{\mu_0}{4}\right)\Omega M_s^2(N_{d-zz} - N_{d-yy})\sin\phi'(t)\sin2\delta,$$

where ω'(t) and Φ'(t) are respectively the instantaneous polar and azimuthal angles of the magnetization vector in the rotated frame, $M_s$ is the saturation magnetization of the magnet, $N_{d-xx}$, $N_{d-yy}$, and $N_{d-zz}$ are the demagnetization factors that can be evaluated from the nanomagnet's dimensions, $\mu_0$ is the permeability of free space, and $\Omega=(\pi/4)$abd is the nanomagnet's volume.

The potential energy $E_m(t)$ due to the static magnetic flux density B applied along the in-plane hard axis is given by $$E_m(t)=M_s\Omega B[\cos\theta'(t)\sin\delta-\sin\theta'(t)\sin\phi'(t)\cos\delta] \quad \text{(Equation 3)}$$

The stress anisotropy energy is given by $$E_{str}(t) = -\frac{3}{2}\lambda_s\epsilon(t)Y\Omega\cos^2\theta'(t), \quad \text{(Equation 4)}$$

where is the magnetostriction coefficient, Y is the Young's modulus, and ∈(t) is the strain generated by the applied voltage $V_{MN}$ at the instant of time t. In this example, only the uniaxial strain along the line joining the two electrodes is considered, but the strain is actually biaxial resulting in tension/compression along that line and compression/tension along the perpendicular direction. The torques due to these two components add. Therefore, this example underestimates the stress anisotropy energy, which makes all the example figures conservative. The example calculations omit any contribution due to the dipolar interaction of the hard magnet since it is negligible with the use of a synthetic anti-ferromagnet (SAF).

The total potential energy of the nanomagnet at any instant of time t is therefore $$E(t)=E(\theta'(t),\phi'(t))=E_{sh}(t)+E_m(t)+E_{str}(t). \quad \text{(Equation 5)}$$

The above result is used to plot the energy profiles as a function of θ for Φ=90° in FIGS. 5 and 6.

The time evolution of the polar and azimuthal angles of the magnetization vector in the rotated coordinate frame is determined under the actions of the torques due to the shape anisotropy, stress anisotropy, magnetic field, and thermal noise.

The torques that rotate the magnetization of the shape-anisotropic magnet in the presence of stress can be written as $$\tau_{ss}(t) = -m(t) \times \left(\frac{\partial E}{\partial \theta'(t)}\hat{\theta} + \frac{1}{\sin\theta'(t)}\frac{\partial E}{\partial \phi'(t)}\hat{\phi}\right) \quad \text{(Equation 6)}$$
$$= \{E_{\phi1}(t)\sin\theta'(t) + E_{\phi2}(t)\cos\theta'(t) - M_s\Omega B\cos\delta\cos\phi'(t)\}\hat{\theta} -$$
$$\{E_{s1}(t)\sin2\theta'(t) + 2E_{s2}(t)\cos2\theta'(t) - M_s\Omega B(\cos\delta\sin\phi'(t)\cos\theta'(t) + \sin\delta\sin\theta'(t)) +$$
$$(3/2)\lambda_s\epsilon(t)Y\Omega\sin2\theta'(t)\}\hat{\phi},$$

where m(t) is the normalized magnetization vector, quantities with carets are unit vectors in the original frame of reference, and $$E_{\phi1}(t) = \frac{\mu_0}{2}M_s^2\Omega\{(N_{d-yy}\cos^2\delta + N_{d-zz}\sin^2\delta)\sin2\phi'(t) - N_{d-xx}\sin2\phi'(t)\}$$
$$E_{\phi2}(t) = \frac{\mu_0}{2}M_s^2\Omega(N_{d-zz} - N_{d-yy})\sin2\delta\cos\phi'(t).$$

At non-zero temperatures, thermal noise generates a random magnetic field h(t) with Cartesian components ($h_x(t)$, $h_y(t)$, $h_z(t)$) that produces a random thermal torque which can be expressed as $$\tau_{th}(t)=\mu_0 M_s\Omega m(t)\times h(t)=-\mu_0 M_s\Omega[h_\phi(t)\hat{\theta}-h_\theta(t)\hat{\phi}],$$

where $$h_\theta(t)=h_x(t)\cos\theta'(t)\cos\phi'(t)+h_y(t)\cos\theta'(t)\sin\phi'(t)-h_z(t)\sin\theta'(t)$$

$$h_\phi(t)=-h_x(t)\sin\phi'(t)+h_y(t)\cos\phi'(t). \quad \text{(Equation 7)}$$

In order to find the temporal evolution of the magnetization vector under the vector sum of the different torques mentioned above, we solve the stochastic Landau-Lifshitz-Gilbert (LLG) equation:

$$\frac{dm(t)}{dt} - \alpha\left[m(t)\times\frac{dm(t)}{dt}\right] = \frac{-|\gamma|}{\mu_0 M_s\Omega}(\tau_{ss}(t) + \tau_{th}(t)) \quad \text{(Equation 8)}$$

From the above equation, we can derive two coupled equations for the temporal evolution of the polar and azimuthal angles of the magnetization vector:

$$\frac{d\theta'(t)}{dt} = \frac{|\gamma|}{(1+\alpha^2)\mu_0 M_s \Omega} \{E_{\phi1}(t)\sin\theta'(t) + E_{\phi2}(t)\cos\theta'(t) - M_s\Omega B\cos\delta\cos\phi'(t) - \mu_0 M_s \Omega h_\phi(t) + \alpha\{E_{s1}(t)\sin 2\theta'(t) - \mu_0 M_s \Omega h_\theta(t) + 2E_{s2}(t)\cos 2\theta'(t) + (3/2)\lambda_s\epsilon(t)Y\Omega\sin 2\theta'(t) - M_s\Omega B(\cos\delta\sin\phi'(t)\cos\theta'(t) + \sin\theta'(t)\sin\delta)\}\}$$

(Equation 9)

$$\frac{d\phi'(t)}{dt} = \frac{|\gamma|}{\sin\theta'(t)(1+\alpha^2)\mu_0 M_s \Omega} \{E_{s1}(t)\sin 2\theta'(t) + 2E_{s2}(t)\cos 2\theta'(t) + (3/2)\lambda_s\epsilon(t)Y\Omega\sin 2\theta'(t) - M_s\Omega B(\cos\delta\sin\phi'(t)\cos\theta'(t) + \sin\delta\sin\theta'(t)) - \mu_0 M_s\Omega h_\theta(t) - \alpha(E_{\phi1}(t)\sin\theta'(t) + E_{\phi2}(t)\cos\theta'(t) - M_s\Omega B\cos\delta\cos\phi'(t) - \mu_0 M_s\Omega h_\phi(t))\}.$$

(Equation 10)

Solutions of these two equations yield the magnetization orientation (θ'(t), Φ'(t)) at any instant of time t. Since the thermal torque is random, the solution procedure involves generating switching trajectories by starting each trajectory with an initial value of (θ', Φ') and finding the values of these angles at any other time by running a simulation using a time step of Δt=1 ps and for a sufficiently long duration. At each time step, the random thermal torque is generated stochastically. The time step is equal to the inverse of the maximum attempt frequency of demagnetization due to thermal noise in nanomagnets. The duration of the simulation is always sufficiently long to ensure that the final results are independent of this duration, and they are also verified to be independent of the time step.

The permanent magnetic field (B=0.1305 T) applied along the +y-direction (hard axis of the soft magnet 406) makes the two stable states of the soft magnet's magnetization align along $\Psi_1$ ($\theta=\theta_1=46.8°$) and $\Psi_0$ ($\theta=\theta_0=133.2°$) leaving a separation angle γ of 86.3° between them. Thermal noise however will make the magnetization of the soft magnet fluctuate around these two orientations and in order to determine the thermal distribution around $\Psi_1$ (which is where the RESET operation leaves the magnetization), the last two equations are solved in the absence of any stress by starting with the initial state θ=46.8° and Φ=90° and obtaining the final values of θ and Φ by running the simulation for a long time. This process is repeated for 100 million switching trajectories. A histogram is then generated from these 100 million switching trajectories for the final values of θ and Φ, which yields the thermal distribution around $\Psi_1$.

To study the switching dynamics under the influence of stress, 100 million switching trajectories were generated in the stressed state of the magnet by solving Equations 9 and 10, again using a time step of 1 ps. This time the initial magnetization orientation for each of the $10^8$ trajectories is chosen from the thermal distributions generated in the previous step with the appropriate weighting since the RESET step always leaves the magnetization around state $\Psi_1$. The simulation is continued for 1.5 ns. It was found that when the stress is either tensile (+10 MPa corresponding to $V_{MN}=-V_0/12$), or compressive but weak (-10 MPa corresponding to $V_{MN}=V_0/12$), the magnetization's polar angle returns to within 4° of $\Psi_1$ ($\theta=\theta_1=46.8°$) in 1.3 ns or less for every one of the $10^8$ trajectories. After 1.3 ns, the stress is removed abruptly and the simulation is continued for an additional 0.2 ns to ensure that the final state does not change. It did not change for any of the $10^8$ trajectories. This procedure indicates that when the inputs to the logic gate are both low, or one is high and the other is low, the magnetization of the soft layer of the MTJ does not rotate and the MTJ resistance remains high with >99.999999% probability. This fulfills the requirements of an NAND gate with >99.999999% probability.

In the case of one input low and one input high, what prevents rotation from $\Psi_1$ to $\Psi_0$ is the energy barrier of 23.63 kT between these two states. This barrier is high enough to reduce the switching probability to below $10^{-8}$.

When both inputs are high, a compressive stress of −30 MPa is generated in the magnetostrictive magnet. Once again, the initial orientations of the magnetization from the thermal distribution are chosen around $\Psi_1$ which is where the RESET step leaves the magnet, and 100 million switching trajectories are generated as before. This time θ approaches within 4° of final state $\Psi_0$ ($\theta=\theta_0=133.2°$) in 1.3 ns or less. The simulation was continued for an additional 0.2 ns to confirm that once the magnetization reaches the vicinity of $\Psi_0$, it settles around that orientation and does not return to the neighborhood of the initial orientation $\Psi_1$. This procedure was repeated for $10^8$ times with the result that every single switching trajectory behaved in the above manner. Therefore, it is concluded that when the inputs to the logic gate are both high, the magnetization of the soft layer 406 of the MTJ does rotate and the MTJ resistance goes low with >99.999999% probability. That fulfills the remaining requirement of an NAND gate with >99.999999% probability.

The above described behavior and operation of gate 400 translates to NAND logic. Since there is no substantial electric field in the piezoelectric layer 402 directly under the MTJ stack 401, it is acceptable to neglect any voltage drop in the piezoelectric layer 402 between the magnetostrictive magnet 406 and the silicon substrate 403. Therefore, $V_{out}=I_{BIAS}R_{MTJ}$, where $R_{MTJ}$ is the resistance of the MTJ stack 401. (As used herein, the terms "MTJ stack" and "MTJ" are interchangeable.) The biasing constant current source $I_{BIAS}$ is set to $V_0/R_{high}$, where $R_{high}$ is the resistance of MTJ 401 in the high-resistance state. Therefore, whenever MTJ 401 is in the high resistance state, the output voltage is $V_0$, and whenever MTJ 401 is in the low resistance state, the output voltage is $I_{BIAS}R_{low}=V_0/2$ because $R_{low}=R_{high}/2$ ($R_{low}$ is the resistance of MTJ 401 in the low resistance state). Since the logic bit 1 is encoded in voltage $V_0$ and logic bit 0 is encoded in the voltage level $V_0/2$, we find that the output bit is 1 when either input bit is 0, and the output bit is 0 when both input bits are 1. In other words, we have successfully implemented a NAND gate (see the truth table shown in Table 1 below).

TABLE 1

Truth Table for NAND Logic Gate.

| $V_{in1}$ | $V_{in2}$ | $V_{out}$ |
|---|---|---|
| 0 | 0 | 1 |
| 0 | 1 | 1 |
| 1 | 0 | 1 |
| 1 | 1 | 0 |

Gate 400 fulfills one or more (and in a preferred embodiment, all) of the following requirements of a Boolean logic gate:

a. Concatenability: For concatenability, the output voltage of a preceding gate has to be fed directly to the input of a succeeding gate. This requires that $V_{in1}(\text{high})=V_{in2}(\text{high})=I_{BIAS}R_{high}=V_0$, and $V_{in1}(\text{low})=V_{in2}(\text{low})=I_{BIAS}R_{low}=V_0/2$ which is easily achieved by choosing $I_{BIAS}=V_0/R_{high}$. In some embodiments, the logic levels may be encoded in $V_0$ and $xV_0$ ($0.5 \le x \le 1$), in which case the resistive network at the input side and $V_{BIAS}$ should be adjusted accordingly. Such adjustments of resistances for resistors R and the voltage for $V_{BIAS}$ is within the skill of one of ordinary skill in the art once such person is familiarized with the teachings herein.

b. Non-linearity: Since the resistance of MTJ 401 has only two values (i.e., high and low), the gate is inherently non-linear.

c. Isolation between input and output: The output voltage $V_{out}$ cannot change the input voltage levels $V_{in1}$ and $V_{in2}$ of the same gate 400 in any way. This results in isolation.

d. Gain: Gain is ensured when the energy to switch the output bit does not come from the input energy but rather comes from an independent power source. In exemplary embodiments of the present invention, the energy to switch the output bit is supplied by the constant current source $I_{BIAS}$. Whenever the inputs $V_{in1}$ and $V_{in2}$ switch the resistance of MTJ 401 (be it low to high or high to low), the independent current source $I_{BIAS}$ switches $V_{out}$. As such, gate 400 has gain.

e. Universal logic: Gate 400 performs NAND operation which is universal.

f. Scalability: Exemplary embodiments use only voltage to switch specific gates 400.

This is a notable and consequential difference from prior art which use magnetic fields to switch gates. When magnetic fields are used for switching, neighboring gates must be spaced relatively far apart on the substrate to ensure that fringing magnetic fields from one gate do not influence a neighboring gate. This limitation is overcome by exemplary embodiments disclosed herein. Because magnetic fields are not used to switch specific gates 400, gates 400 do not have to be spaced far apart. As a result, gates can be placed close to each other, thereby increasing the gate density. Gates 400 can scale all the way down to the superparamagnetic limit of the nanomagnets at the operating temperature (e.g., room temperature).

g. Error-resilience: Two types of errors afflict non-volatile gate operation: i) static errors caused by the magnetization of the soft magnetostrictive layer 406 flipping spontaneously owing to thermal noise (thereby switching the output bit erroneously when the inputs are grounded and $V_{in1}=V_{in2}=0$), and ii) dynamic errors that occur when the output switches to an incorrect state in response to the inputs changing. The static error probability is determined by the energy barrier separating the two stable magnetization states in the soft layer 406. The minimum barrier height is determined by the strength of the magnetic field B applied with the permanent magnets 408, the dimensions of the soft magnet 406, and material parameters. In the case of a gate 400 with specific dimensions as provided above as an illustrative exemplary embodiment, the minimum barrier height was 69.26 kT at room temperature, giving a static error probability of $\sim e^{-69.26} \approx 10^{-30}$ per spontaneous switching attempt. In other words, the retention time of an output bit in an exemplary non-volatile logic gate 400 at room temperature is $\sim(1/f_0) e^{69.26} = 3.8 \times 10^{10}$ years, since the attempt frequency $f_0$ in nanomagnets will very rarely exceed 1 THz. In other words, gate 400 is indeed non-volatile. Dynamic gate errors, however, are much more probable than static errors and accrue from two sources: (1) thermal noise causing erratic magnetization dynamics that drive magnets to the wrong stable magnetization state resulting in bit error, and (2) complicated clocking schemes that require precise timing synchronization for gate operation and whose failure cause bit errors.

The gate in (Behin-Aein, B., Datta, D., Salahuddin, S. & Datta S., Proposal for an all-spin logic device with built-in memory. *Nature Nanotech.* 5, 266-269 (2010)) works with Bennett clocking which is predicated on the principle of placing the output magnet in its maximum energy state, and then waiting for the input signal to drive it to the desired one among its two minimum energy states to produce the correct output bit. This strategy is risky since the maximum energy state is also maximally unstable. While perched on the energy maximum, thermal fluctuations can drive the output magnet to the wrong minimum energy state with unacceptably high probability, resulting in unacceptable bit error rates. A later modification (Srinivasan, S., Sarkar, A., Behin-Aein, B. & Datta, S. All-spin logic device with in-built non-reciprocity. *IEEE Trans. Magn.* 47 4026-4032 (2011)) overcame this shortcoming, but at the expense of much increased energy dissipation. Moreover, the logic gate disclosed by Srinivasan et al. also requires a complicated clocking sequence without which it cannot operate. In contrast, exemplary embodiments for a logic gate as disclosed herein never place any element of the gate 400 at the maximum energy state (no Bennett clocking) and no complicated clocking sequence is needed.

Figure 8:
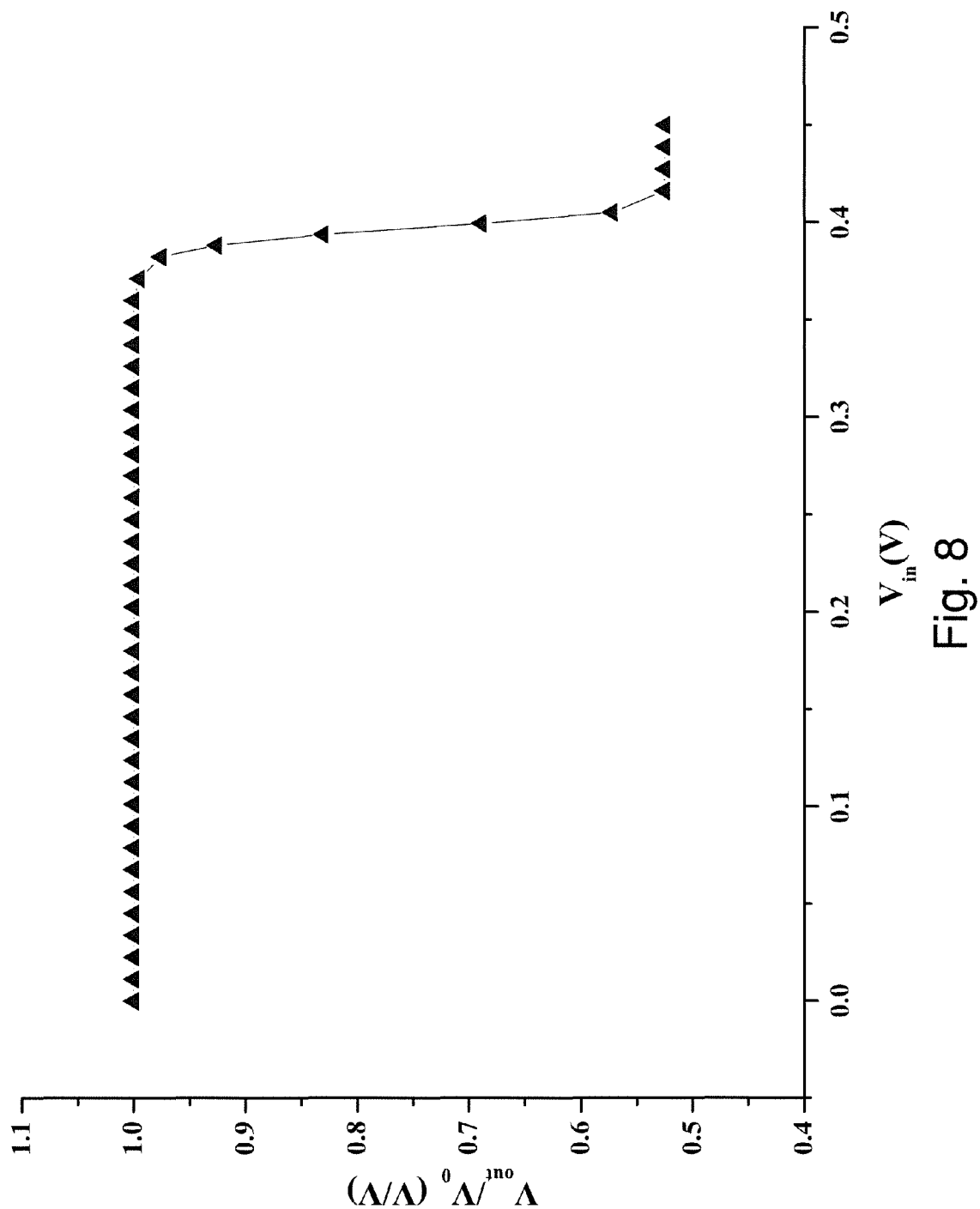
FIG. 8 shows transfer characteristic of the exemplary gate in the inverter mode. Shorting the two inputs of a NAND gate makes it an inverter and that is how the inverter mode characteristic is calculated. The transfer characteristic consists of the plot of output voltage $V_{out}$ versus input voltage $V_{in}$ of the inverter at room temperature, where the $V_{out}$ values have been thermally averaged.

An important consideration for Boolean logic is logic level restoration. If noise broadens the input voltage levels $V_0$ and $V_0/2$, thereby making it harder to distinguish between bits 0 and 1, the gate 400 restores the distinguishability by ensuring that the output voltage levels $V_{out}$ are not broadened and remain well separated. To achieve this effect, the transfer characteristic ($V_{out}$ versus $V_{in}$) of the gate (when used as an inverter) must show a sharp transition. When the two inputs of the NAND gate 400 are shorted with one another, the gate behaves like a NOT gate (inverter). If the input voltage to the inverter is between $V_0/12$ and $V_0/4$ (e.g., the compressive stress is between $-10$ MPa and $-30$ MPa), the energy profile becomes such that the magnetization of the soft layer may rotate to an intermediate state between $\Psi_0$ and $\Psi_1$ and fluctuate around that orientation because of thermal noise. A time-average over the fluctuations determines the 'steady-state' mean orientation at that input voltage $V_{in}$. From this, $R_{MTJ}$ and $V_{out}=V_0 R_{MTJ}/R_0$ are calculated. In order to do this, the stress generated by the $V_{MN}$ corresponding to the input is calculated. The stochastic Landau-Lifshitz-Gilbert simulation is then run to determine the steady-state magnetization orientation and $V_{out}$. The purpose of this exercise is to find the transfer characteristic $V_{out}$ versus $V_{in}$. The transition range was determined to be from 0.38 V to 0.41 V (a range of 0.03 V) of input voltage whereas the logic levels are 0.225 V and 0.45 V in the exemplary embodiment. This portends excellent logic level restoration capability. In the high state, the input voltage can drift down by 0.04 volts and still produce the correct output state, while in the low state, the input voltage can drift up by 0.155 volts and still produce the correct output state. The transfer characteristic is shown in FIG. 8. The evident sharpness of the transition allows for excellent logic level restoration capability.

A gate 400 such as is shown in FIGS. 4(*a*) and 4(*b*) has unprecedented energy-efficiency that far exceeds that of prior non-volatile NAND gates. There are four contributions to the energy dissipated in this logic gate during a logic operation: internal dissipation due to Gilbert damping that occurs while the magnetostrictive layer's magnetization switches (rotates), energy $C(V_{MN})^2$ dissipated in turning on/off the potential $V_{MN}=\pm V_0/4$ ($=112.5$ mV) abruptly or non-adiabatically during the RESET stage or logic operation stage (where C is the capacitance between the shorted pair of electrodes EE' and the n$^+$-Si substrate 403), the energies dissipated in the resistors R, and the maximum energy $V_0^2/R_{high}$ dissipated in the MTJ 401 when the output is high (the energy dissipated when the output is low is $V_0^2/4R_{low}=V_0^2/2R_{high}$, which is 50% lower). The energies dissipated in the resistors R are made arbitrarily small by choosing arbitrarily high values for R; hence, this contribution is negligible and may be treated as zero. The energy dissipated due to Gilbert damping in a magnet is given by $$E_{d\_gd} = \int_0^{t_s} P_{d\_gd}(t)\,dt, \quad \text{(Equation 11)}$$

where $t_s$ is the switching delay (counted between the time the magnetization leaves the vicinity of $\Psi_1$ and arrives within 4° polar angle of $\Psi_0$) and $P_{d\_gd}(t)$ is the power dissipation and can be expressed as $$P_{d\_gd}(t) = \frac{\alpha\gamma}{(1+\alpha^2)\mu_0 M_s \Omega}|\tau_{eff}(t)|^2, \quad \text{(Equation 12)}$$

where $\tau_{eff}(t)$ is the torque due to shape anisotropy, stress anisotropy and the torque due to magnetic field (the thermal torque does not dissipate energy). The energy dissipation is different for different switching trajectories, and it was found that the mean dissipation is 316 kT at room temperature. This calculation overestimates the energy dissipation slightly, but that only makes the example figures which are stated here conservative.

The next component is the $C(V_{MN})^2$ dissipation. In the exemplary example described, electrodes E and E' have dimensions 100 nm×100 nm and the thickness of the piezoelectric layer 402 is 100 nm. Thus, the capacitance between either electrode (E or E') and the substrate 403 is C=0.88 fF, assuming that the piezoelectric layer 402 is PZT and the relative dielectric constant of PZT is 1000. The voltage $V_{MN}=\pm V_0/4$ (=112.5 mV). Since we have a pair of electrodes EE', the dissipation will be roughly twice (½)$C(V_{MN})^2$. That value is calculated to be 2688 kT.

Finally, the maximum energy dissipation due to current flow through the MTJ stack 401 is considered. This is the bias current $I_{BIAS}$ needed to convert the MTJ resistance state to an output voltage state that encodes the logic bit "0" or "1". Note that the bias current is always flowing and hence results in standby energy dissipation which would be unacceptable in certain applications where the circuit is mostly dormant and wakes up to perform an operation infrequently (e.g. cell phones that wake up and perform a function only when a call or message is received). However, there are many applications where the circuit is constantly busy and seldom, if ever, in a standby mode (e.g. medical applications where the implanted device constantly monitors and processes signals). For such applications, standby dissipation is a not a serious concern.

In order to calculate this energy dissipation, let us assume that for the sake of adequate noise margin, the bias current $I_{BIAS}$ can be no less than 1 pA. This restricts $R_{high}$ to $V_0/I_{BIAS}=0.45\times10^{12}$ ohms. The MTJ's resistance will increase super-linearly (almost exponentially) with the spacer layer thickness since current flows by tunneling through this layer, so the above resistance is not difficult to achieve. The resulting maximum energy dissipation $V_0^2 t_s/R_{low}$ is 0.28 kT, which is negligible. Consequently, in a gate operation, the maximum energy dissipation is 2688+316 kT=3004 kT (12.5 aJ), which is comparable to that of low-power CMOS based NAND gates. Notably, however, the latter is volatile while the present gate 401 is non-volatile. The energy dissipation of a gate 401 is almost two orders of magnitude smaller than that in other magnetic non-volatile logic gates. The overall energy delay product (1.6×10$^{-26}$ J-s) is at least one order of magnitude superior to that of any other magnetic (non-volatile) logic gate while the associated error probability of 10$^{-8}$ is also vastly superior.

Logic gates 400 such as is shown in FIGS. 4(*a*) and (4*b*) may have applications such as but not limited to medically implanted processors such as pacemakers or devices implanted in an epileptic patient's brain that monitor brain signals and warn of an impending seizure. Such devices need to "wake up" and process signals immediately after receipt of an erratic pulse with minimal boot time, hence there is a need for non-volatile logic. Such devices also need to dissipate very little energy so that they may be powered by the patient's movements (e.g., head movements) and not require a battery. Logic gates 400 such as is shown in FIGS. 4(*a*) and 4(*b*) are well tailored for such applications as well as human powered wearable computing devices in general.

The following is one exemplary method of manufacturing a gate 400 such as is shown in FIGS. 4(*a*) and 4(*b*), although manufacture of such a gate is not limited to the following description and may be subject to variations and some differences depending on the implementation of a particular embodiment. To fabricate the gate, a piezoelectric (PZT) thin film (~100 nm thick) is deposited on a conducting n$^+$-Silicon substrate which is grounded through a bias voltage $V_{BIAS}$. A skewed MTJ stack is fabricated on top of the PZT film. The bottom layer material is chosen as Terfenol-D because of its large magnetostriction (900 ppm). The magnetostriction is positive which tends to make the magnetization align along the direction of tensile stress and perpendicular to the direction of compressive stress. The angle between the major axes of the two elliptical nanomagnets is determined by the angular separation between $\Psi_1$ and $\Psi_0$. In the embodiment shown in FIG. 4(*b*), the angle between $\Psi_1$ and $\Psi_0$ is approximately 90°, and the angle between the major axes of the two elliptical nanomagnets is approximately 30°. The current source $I_{BIAS}$ is connected across the MTJ stack. The magnetostrictive nanomagnet has a major axis of 100 nm, minor axis of 42 nm and thickness of 16.5 nm, which ensures that it has a single ferromagnetic domain.

To evaluate the dynamic error probability, the magnetization dynamics of the soft magnetostrictive magnet induced by stress in the presence of thermal noise is modeled by the stochastic Landau-Lifshitz-Gilbert equation. Above, results are presented of simulations to show that if $V_0$=0.45V, then switching is accomplished in 1.3 ns and the dynamic error probability associated with incorrect switching is less than 10$^{-8}$ in every gate operation if the voltage is kept on for 1.3 ns. Therefore, the gate can work at a clock frequency of ~1/1.3 ns>0.75 GHz with an error probability <10$^{-8}$. Stated succinctly, the probability of the output voltage being low when both inputs are high is >99.999999% and the probability of it being low when either input is low is <10$^{-8}$. In other words, the NAND gate works with >99.999999% fidelity. This number may be unimpressive if used to describe a transistor-based volatile logic gate. However, in regard to magnetic non-volatile logic gates, it is remarkable. Known non-volatile magnetic logic gates typically have very high error probabilities. The degree of error-resilience in a gate 400 may be sufficient for use in stochastic logic architectures.

In an embodiment, the logic gate 400 is usable as an artificial neuron that performs a threshold function. There are many input terminals instead of just two, and the resistors connected to the input terminals (e.g., $V_{in1}$, $V_{in2}$) are $R_1, R_2, \ldots R_n$, instead of all being R. Using superposition, we obtain that the voltage $V_{MN}$ that is dropped over the piezoelectric layer 402 is given by $$V_{MN} = \left(\sum_{M=1}^{n} W_M V_{inM}\right) - V_{BIAS} \quad \text{(Equation 13)}$$

where $$W_M = \frac{R\|R_1\|R_2\|\bullet\bullet R_{M-1}\|R_{M+1}\bullet\bullet R_n}{R_M + R\|R_1\|R_2\|\bullet\bullet R_{M-1}\|R_{M+1}\bullet\bullet R_n}$$

is the "weight" of the M-th input (with the ∥ symbol indicating parallel combination of resistances). When this voltage $V_{MN}$ exceeds a certain threshold $V_t$, the stress generated in the soft layer 406 rotates its magnetization from the initial stable state (where it was left by the RESET operation) to the other stable state. The predetermined threshold $V_t$ is determined by a size, shape, material composition, and processing (i.e., the growth/manufacturing method) of the soft magnetic layer 406 as well as the magnitude and direction of the permanent magnetic field B and the bias voltage $V_{BIAS}$. The output voltage therefore switches abruptly when the weighted sum of the inputs $$\sum_{M=1}^{n} W_M V_{inM}$$

exceeds $V_t + V_{BIAS}$. Therefore, the system acts like an artificial neuron that fires when a threshold is exceeded, where the resistor network at the input terminals behave as artificial synapses and the resistance values determine the synapse weights.

While the invention has been described in terms of exemplary embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

What is claimed is:

1. A non-volatile magneto-elastic memory cell, comprising:
   a substrate over which a piezoelectric film is deposited, wherein the substrate is conductive or an additional conducting layer is interposed between the substrate and the piezoelectric film;
   a magneto-tunneling junction (MTJ) formed on the piezoelectric film comprising a hard magnetic layer, a spacer layer, and a soft magnetic layer,
      wherein the hard magnetic layer is permanently magnetized along one direction,
      wherein the soft magnetic layer consists of a magnetostrictive nanomagnet in elastic contact with the piezoelectric film and has a magnetization vector with two stable orientations that are more than 90° apart; and
   at least two pairs of electrodes arranged over the piezoelectric film, wherein a line joining the members of a first pair of electrodes and a line joining the members of a second pair of electrodes cross the soft magnetic layer,
   wherein the line joining the members of the first pair of electrodes and the line joining the members of the second pair of electrodes are non-parallel to one another and to the two stable orientations of the magnetization vector of the soft magnetic layer,
   wherein sequential applications of voltage to the at least two pairs of electrodes generate electric fields causing a strain in the piezoelectric film, said strain being transferred to the soft magnetic layer causing a rotation of the magnetization vector from one of the two stable orientations to the other, thereby changing a resistance of the MTJ from a high state to a low state or from the low state to the high state,
   wherein the first pair of electrodes is arranged so that the application of a first voltage to the first pair of electrodes generates an electric field which causes a first strain in the piezoelectric film, the first strain being transferred to the soft magnetic layer so as to cause a rotation of the magnetization vector to a first intermediate orientation that subtends an angle of 90° or less with an initial stable orientation of the magnetization vector,
   wherein the last pair of electrodes is arranged so that the application of a voltage to the last pair of electrodes generates another electric field which causes another strain in the piezoelectric film, the strain being transferred to the soft magnetic layer so as to cause further rotation of the magnetization vector to an intermediate orientation that subtends an angle of greater than 90° with the initial stable orientation of the magnetization vector, and
   wherein upon removal of stress from the last pair of electrodes the magnetization decays to the second stable orientation, and
   wherein one of the stable orientations encodes a binary bit of "0" and the other a binary bit of "1".

2. The non-volatile magneto-elastic memory cell of claim 1, wherein the line joining the members of the first pair of electrodes and the line joining the members of the second pair of electrodes pass through a center of the soft magnetic layer.

3. The non-volatile magneto-elastic memory cell of claim 1, wherein the soft magnetic layer is an ellipse, rectangle, parallelogram, or any other shape with two stable magnetization orientations.

4. The non-volatile magneto-elastic memory cell of claim 1, wherein members of each pair of the at least two pairs of electrodes are electrically shorted with one another.

5. The non-volatile magneto-elastic memory cell of claim 1, wherein the two stable orientations of the magnetization vector of the soft magnetic layer are substantially 180° apart.

6. A non-volatile universal logic gate and/or memory cell, comprising:
   a substrate over which a piezoelectric film is deposited, wherein the substrate is conductive or an additional conducting layer is interposed between the substrate and the piezoelectric film;
   a skewed magneto-tunneling junction (MTJ) formed on the piezoelectric film, comprising
      a soft magnetic layer consisting of a magnetostrictive nanomagnet in elastic contact with the piezoelectric film, wherein the soft magnetic layer has a magnetization vector with two stable orientations, a spacer layer, and a hard magnetic layer permanently magnetized along a direction that subtends a non-zero angle with a magnetization of the soft magnetic layer in an absence of external forces;

a magnetic field source providing a permanent magnetic field; and at least one pair of electrodes arranged over the piezoelectric film such that a line joining members of the at least one pair of electrodes crosses the soft magnetic layer, wherein application of a voltage to a pair of electrodes of the at least one pair of electrodes generates electric fields causing a strain in the piezoelectric film, said strain being transferred to the soft magnetic layer, wherein compressive strain which exceeds a first threshold causes the magnetization vector of the soft magnetic layer to maintain or rotate to one of the two stable orientations, and tensile strain which exceeds a second threshold causes the magnetization vector to maintain or rotate to the other of the two stable orientations, wherein a resistance of the MTJ is a high state when the magnetization vector of the soft magnetic layer has one of the two stable orientations and a low state when the magnetization vector has the other of the two stable orientations, wherein either the high state or the low state of the resistance of the MTJ encodes a binary bit of "0" and the other a binary bit of "1", and wherein the magnetization vector of the soft magnetic layer maintains a constant orientation in the absence of strain in the piezoelectric film.

7. The non-volatile universal logic gate and/or memory cell of claim 6, wherein the first and second thresholds are determined by the shape anisotropy, material composition, and processing of the soft magnetic layer; and the magnitude and direction of the permanent magnetic field.

8. The non-volatile universal logic gate and/or memory cell of claim 7, wherein the non-volatile logic gate and/or memory cell is configured as an NAND gate with the soft magnetic layer having a high shape anisotropy.

9. The non-volatile universal logic gate and/or memory cell of claim 7, wherein the non-volatile logic gate and/or memory cell is configured as an NOR gate with the soft magnetic layer having a low shape anisotropy.

10. The non-volatile universal logic gate and/or memory of claim 6, wherein the permanent magnetic field is directed along the hard axis of the soft magnetic layer, the hard axis being a direction of maximal energy instability.

11. The non-volatile universal logic gate and/or memory cell of claim 6, wherein the line joining the members of the at least one pair of electrodes passes through a center of the soft magnetic layer.

12. The non-volatile universal logic gate and/or memory cell of claim 6, further comprising first and second voltage-in lines which, when voltages are applied thereto, determine a magnitude and/or polarity of the voltage applied to the pair of electrodes, said voltage determining whether the magnetization vector of the soft magnetic layer maintains or rotates to a first or a second of the two stable orientations.

13. The non-volatile universal logic gate and/or memory cell of claim 6, further comprising a constant current source and bias voltage source which provide for an output voltage indicative of the resistance of the MTJ and hence the encoded binary bit.

14. The non-volatile universal logic gate and/or memory cell of claim 13, wherein the non-volatile universal logic gate and/or memory cell is configured as an artificial neuron comprising a plurality of voltage input terminals, wherein when multiple input voltages are applied at the input terminals and a weighted sum of the input voltages exceeds a predetermined threshold, the output voltage changes abruptly, wherein the abrupt output voltage change mimics the firing of a neuron, wherein a resistive network at the input terminals behaves as a collection of synapses, wherein the "weights" of the synapses are determined by resistances in the resistive network, and wherein the predetermined threshold for firing is determined by a size, shape, material composition, and processing of the soft magnetic layer; magnitude and direction of the permanent magnetic field; and a bias voltage $V_{BIAS}$ of the bias voltage source.

15. The non-volatile universal logic gate and/or memory cell of claim 6, wherein in-plane dimensions of the at least one pair of electrodes are approximately equal to a thickness of the piezoelectric film.

16. The non-volatile universal logic gate and/or memory cell of claim 6, wherein members of the at least one pair of electrodes are separated by a distance approximately equal to 1-2 times the thickness of the piezoelectric film.

17. The non-volatile universal logic gate and/or memory cell of claim 6, wherein members of each pair of electrodes are electrically shorted with one another.

18. The non-volatile universal logic gate and/or memory cell of claim 6, wherein the line joining members of a pair of electrodes of the at least one pair of electrodes is approximately aligned with the direction of permanent magnetization of the hard magnetic layer.

19. A write cycle for storing a binary bit (0 or 1) to a magneto-tunneling junction (MTJ) that includes a soft magnetic layer having a magnetization vector with two stable orientations more than 90° apart, comprising steps of:

measuring a resistance of the MTJ to determine an initial stored bit;

if the initial stored bit matches the binary bit which is to be stored, terminating the write cycle; and if the initial stored bit does not match the binary bit which is to be stored, i) applying a first voltage to a first pair of electrodes so as to generate an electric field which causes a first strain in a piezoelectric layer in elastic contact with the soft magnetic layer, said first strain being transferred to the soft magnetic layer so as to cause a rotation of the magnetization vector to a first intermediate orientation that subtends an angle of 90° or less with an initial stable orientation of the magnetization vector;

ii) applying a second voltage to a second pair of electrodes so as to generate a second electric field which causes a second strain in the piezoelectric layer and then removing the first voltage from the first pair of electrodes, the second strain being transferred to the soft magnetic layer so as to cause a rotation of the magnetization vector to a second intermediate orientation that subtends an angle of greater than 90° with the initial stable orientation of the magnetization vector; and iii) removing the second voltage so as to allow the magnetization vector of the soft magnetic layer to rotate to a final stable orientation different from the initial stable orientation, wherein one of either the initial stable orientation and the final stable orientation encodes a binary bit of "0" and the other a binary bit of "1".

20. A method for controlling a non-volatile universal logic gate and/or memory cell comprising a magneto-tunneling junction (MTJ) with a soft magnetic layer, the soft magnetic layer consisting of a magnetostrictive nanomagnet, which is in elastic contact with a piezoelectric layer, comprising steps of:

applying a permanent magnetic field across the soft magnetic layer so as to bring two stable magnetic orientations thereof into nearly perpendicular in-plane directions;

setting the MTJ to a high resistance state by applying voltages of appropriate polarity and magnitude at two input terminals, the voltages causing a rotation of the magnetization vector of the soft magnetic layer to an orientation approximately anti-parallel to a permanent magnetization of a hard layer of the MTJ; and then applying input voltages at the two input terminals with the input voltages each encoding an input bit which is either "0" or "1", wherein if the input voltages both encode an input bit of "1", sufficient strain is generated in the piezoelectric layer and the soft magnetic layer to rotate a magnetization vector thereof to an orientation roughly perpendicular to the permanent magnetization of the hard layer such that the MTJ takes a low resistance state encoding an output bit of "0", else the magnetization vector of the soft magnetic layer does not rotate and the MTJ remains in a high resistance state encoding an output bit of "1", thus realizing a NAND gate.

\* \* \* \* \*